United States Patent
Gangasani et al.

(10) Patent No.: US 10,811,094 B2
(45) Date of Patent: Oct. 20, 2020

(54) MEMORY DEVICES AND OPERATION METHODS THEREOF

(71) Applicant: Samsung Electronics Co., Ltd., Suwon-si, Gyeonggi-do (KR)

(72) Inventors: Venkataramana Gangasani, Suwon-si (KR); Ji-hoon Lim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/437,929

(22) Filed: Jun. 11, 2019

(65) Prior Publication Data

US 2020/0005864 A1 Jan. 2, 2020

(30) Foreign Application Priority Data

Jun. 29, 2018 (KR) .......................... 10-2018-0076112

(51) Int. Cl.
*G11C 13/00* (2006.01)

(52) U.S. Cl.
CPC ........ *G11C 13/0038* (2013.01); *G11C 13/003* (2013.01); *G11C 13/0004* (2013.01); *G11C 13/0023* (2013.01); *G11C 2213/72* (2013.01)

(58) Field of Classification Search
CPC ............ G11C 13/0038; G11C 13/0004; G11C 13/0023
USPC ........................................................ 365/148
See application file for complete search history.

(56) References Cited

U.S. PATENT DOCUMENTS

| | | | |
|---|---|---|---|
| 7,447,092 B2 | 11/2008 | Cho et al. | |
| 8,102,729 B2 | 1/2012 | Lee et al. | |
| 8,189,373 B2 | 5/2012 | Kang et al. | |
| 8,223,529 B2 | 7/2012 | Kim et al. | |
| 8,305,796 B2 | 11/2012 | Chevallier et al. | |
| 8,456,940 B2 | 6/2013 | Hanzawa et al. | |
| 9,165,646 B2 | 10/2015 | Lee | |
| 9,679,642 B2 | 6/2017 | Liu et al. | |
| 2013/0077392 A1* | 3/2013 | Park | G11C 13/0069 365/163 |
| 2014/0198556 A1* | 7/2014 | Lee | G11C 13/004 365/148 |
| 2016/0254035 A1 | 9/2016 | Dayley et al. | |

FOREIGN PATENT DOCUMENTS

JP 2012-185890 A 9/2012

* cited by examiner

*Primary Examiner* — Anthan Tran
(74) *Attorney, Agent, or Firm* — Harness, Dickey & Pierce, P.L.C.

(57) ABSTRACT

A memory device may include a memory cell array including a plurality of memory cells and a compensation resistor electrically connected to the memory cell array. The compensation resistor may generate a cell current compensating for a voltage drop generated in a parasitic resistor of a signal line connected to at least one memory cell of the plurality of memory cells. The compensation circuit may control a magnitude of resistance of a compensation resistor upon receiving an address corresponding to the memory cell. The compensation circuit may increase a magnitude of the cell current based on adjusting the magnitude of resistance of the compensation resistor to be substantially equal to a resistance value of the parasitic resistor.

18 Claims, 18 Drawing Sheets

US 10,811,094 B2

MEMORY DEVICES AND OPERATION METHODS THEREOF

CROSS-REFERENCE TO RELATED APPLICATION

This application claims the benefit, under 35 U.S.C. § 119, of Korean Patent Application No. 10-2018-0076112, filed on Jun. 29, 2018, in the Korean Intellectual Property Office, the disclosure of which is incorporated herein in its entirety by reference.

BACKGROUND

The inventive concepts relate to memory devices and operation methods thereof, and more particularly, to phase change memory devices capable of stably receiving power from one or more memory cells and control methods therefor.

Studies have been made on next generation memory devices, which are nonvolatile and do not require refreshing, according to a demand for high capacity and low power consumption of memory devices. Such next-generation memory devices may be required to have the high integration of dynamic random-access memory (RAM) (DRAM), the non-volatility of a flash memory, and the high-performance of static RAM (SRAM). Memory devices such as phase change RAM (PRAM), nano-floating gate memory (NFGM), polymer RAM (PoRAM), magnetic RAM (MRAM), and ferroelectric RAM (FeRAM) are considered as next-generation memory devices which meet the requirements described above.

SUMMARY

The inventive concepts provide a phase change memory device that provides uniform heat to a memory cell even when a resistance value of a resistor constituting the memory cell changes.

According to some example embodiments, a memory device may include a memory cell array including a plurality of memory cells, and a compensation circuit electrically connected to the memory cell array. The compensation circuit may be configured to generate a cell current to compensate for a voltage drop generated in a parasitic resistor of a signal line connected to at least one memory cell of the plurality of memory cells.

According to some example embodiments, a memory device may include a memory cell array including a plurality of memory cells, a first signal line connected to a first terminal of each of the plurality of memory cells, a second signal line connected to a second terminal of each of the plurality of memory cells, and at least one power compensation resistor which is connected to the first signal line or the second signal line. A resistance value of the power compensation resistor may be based on a cell resistance value of a selected memory cell.

According to some example embodiments, an operation method of a memory device may include selecting one memory cell among a plurality of memory cells; receiving an address corresponding to the one memory cell; and controlling a cell current flowing in the one memory cell based on the address.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Hereinafter, example embodiments of the inventive concepts will be described in detail with reference to the accompanying drawings.

Figure 1:
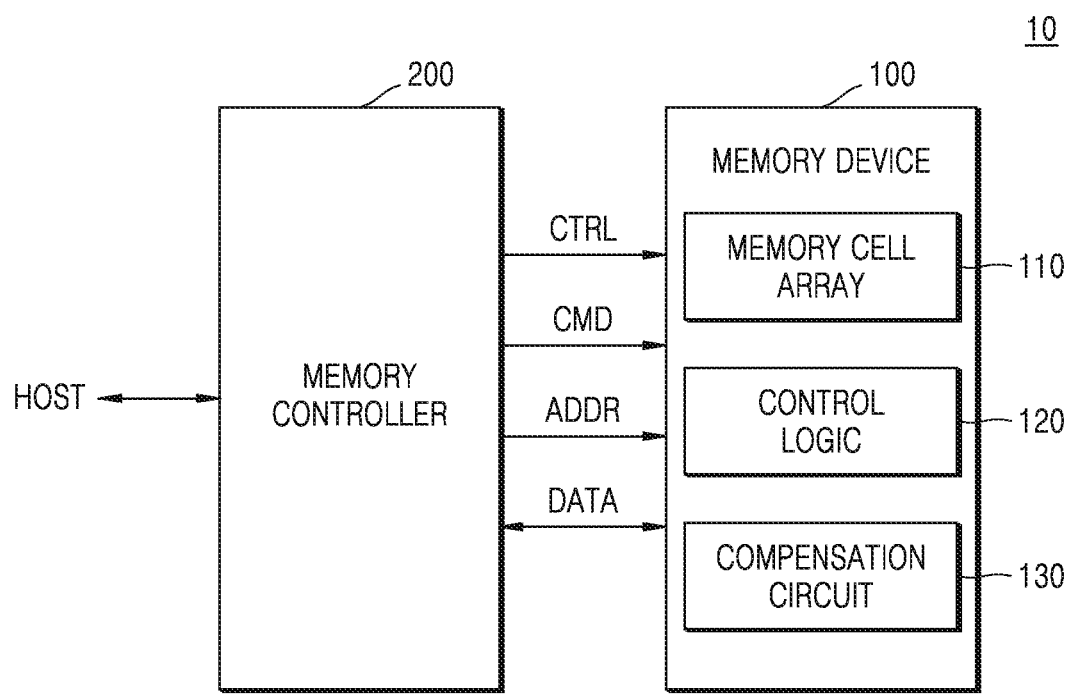
FIG. 1 is a block diagram illustrating a memory system according to some example embodiments.

FIG. 1 is a block diagram illustrating a memory system 10 according to some example embodiments.

Referring to FIG. 1, the memory system 10 may include a memory device 100 and a memory controller 200. The memory device 100 may include a memory cell array 110, control logic 120, and a compensation circuit 130.

The memory controller 200 may control the memory device 100 to write data to the memory device 100 or to read data stored in the memory device 100 in response to a write/read request from a host HOST. The memory controller 200 may control program (or write), read, and erase operations of the memory device 100 by providing an address ADDR, a command CMD, and a control signal CTRL to the memory device 100. In addition, data DATA to be written and data DATA to be read may be transmitted and received between the memory controller 200 and the memory device 100.

Although not shown, the memory controller 200 may further include random-access memory (RAM), a processor, a host interface, and a memory interface. The RAM may be used as an operating memory of the processor, and the processor may control an operation of the memory controller 200. The host interface may include a protocol for performing data exchange between the host HOST and the memory controller 200. For example, the memory controller 200 may be configured to communicate with the host HOST via at least one of various interface protocols such as universal serial bus (USB), multi-media card (MMC), peripheral component interface-express (PCI-E), advanced technology attachment (ATA), serial-ATA, parallel-ATA, small computer system interface (SCSI), enhanced small disk interface (ESDI), and integrated drive electronics (IDE).

The memory controller 200 and the memory device 100 may be integrated into one semiconductor device. Illustratively, the memory controller 200 and the memory device 100 may be integrated into one semiconductor device to form a memory card. For example, the memory controller 200 and the memory device 100 may be integrated into a single semiconductor device and may form a personal computer memory card international association (PCMCIA) card, a compact flash (CF) card, a smart media card (SMC), a memory stick, a multimedia card (MMC), reduced size (RS) MMC (RS-MMC), MMCmicro, a secure digital (SD) card, a miniSD card, a microSD card, a universal flash (UFS) memory, or the like. As another example, the memory controller 200 and the memory device 100 may be integrated into one semiconductor device to form a solid state disk/drive (SSD).

The memory cell array 110 may include a plurality of memory cells (not shown) respectively arranged in regions where a plurality of first signal lines and a plurality of second signal lines cross each other. According to some example embodiments, the plurality of first signal lines may be a plurality of word lines, and the plurality of second signal lines may be a plurality of bit lines. In some example embodiments, the plurality of first signal lines may be a plurality of bit lines, and the plurality of second signal lines may be a plurality of word lines. The memory device 100 including the memory cell array 110 may be referred to as a cross point memory device.

According to some example embodiments, the plurality of memory cells may include resistive memory cells including variable resistive elements (not shown). For example, when the resistance of the variable resistive element as a phase change material (GST, Ge—Sb—Te) changes according to temperature, the memory device 100 may be a phase change RAM (PRAM). As another example, when the variable resistive element includes complex metal oxide in a top electrode, a bottom electrode, and therebetween, the memory device 100 may be resistive RAM (RRAM). As another example, when the variable resistive element includes the top electrode of a magnetic body, the bottom electrode of a magnetic body, and a dielectric material therebetween, the memory device 100 may be magnetic RAM (MRAM). Accordingly, the memory device 100 may be referred to as a resistive memory device, and the memory system 10 may be referred to as a resistive memory system. For convenience of explanation, a case where the memory device 100 is implemented as PRAM is described below.

According to some example embodiments, each of the plurality of memory cells may be a single-level cell (SLC) storing 1-bit data and in this case, the plurality of memory cells may have two resistance distributions depending on stored data. According to some example embodiments, each of the plurality of memory cells may be a multi-level cell (MLC) storing 2-bit data and in this case, the plurality of memory cells may have four resistance distributions depending on stored data. According to some example embodiments, each of the plurality of memory cells may be a triple-level cell (TLC) storing 3-bit data and in this case, the plurality of memory cells may have eight resistance distributions depending on stored data. However, the inventive concepts are not limited thereto, and in some example embodiments, the memory cell array 110 may include memory cells respectively capable of storing four or more bits of data. In addition, the memory cell array 110 may include an SLC and an MLC or a TLC.

The control logic 120 may control all operations of the memory device 100. According to some example embodiments, the control logic 120 may control voltage levels of voltages applied to the first and second signal lines connected to the memory cell array 110 or control the timing at which the voltages are applied. Here, the voltages may include operating voltages applied to selected first and second signal lines and inhibit voltages applied to unselected first and second signal lines.

The compensation circuit 130 may include circuit elements for a stable operation of the memory cell array 110.

The compensation circuit 130 according to some example embodiments may stably provide power supplied to the memory cell. For example, when the variable resistive element is a phase change material, the phase change material may have a reversible phase change between a crystalline state (low resistance) and an amorphous state (high resistance) due to Joule heat generated by power supplied thereto. In this case, the Joule heat may also be influenced by a resistance value of the variable resistive element included in the memory cell. When the resistance value changes between the crystalline state and the amorphous state, uniform Joule heat may not be supplied to the phase change material. Accordingly, the compensation circuit 130 according to some example embodiments may include a power compensation resistor to provide stable power to reduce heat fluctuations in the Joule heat generated in the phase change material. A detailed description thereof is described later. According to some example embodiments, the power compensation resistor may be included in the compensation circuit 130, but may be provided in the first signal line or the second signal line connected to the memory cell array 110.

According to some example embodiments, the compensation circuit 130 may include the power compensation resistor in which a cell current supplied to the phase change material compensates for current loss due to parasitic resistances included in the plurality of first signal lines (for example, bit lines) and the plurality of second signal lines (for example, word lines). Restated, where a parasitic resistance included in a signal line (e.g., at least one signal line of the plurality of first signal lines and/or the plurality of second signal lines) may be understood to be a parasitic resistor of the signal line, such that the compensation circuit 130 may be configured to generate a cell current to compensate for current loss, thereby further compensating for voltage drop generated in the parasitic resistor, due to parasitic resistances. As a parasitic resistance included in the first signal line and the second signal line increases, a magnitude of the cell current may decrease. As the magnitude of the cell current decreases, the power supplied to the phase change material may decrease. In other words, since the Joule heat decreases as the power supplied to the phase change material is reduced, the compensation circuit 130 may include circuit elements that compensate for the current loss due to the parasitic resistance. For example, the compensation circuit 130 may increase a magnitude of the cell current based on adjusting the magnitude of resistance of a compensation resistor of the compensation circuit 130 to be equal or substantially equal (e.g., equal within manufacturing tolerances and/or material tolerances) to a magnitude of resistance of the parasitic resistance (e.g., a magnitude of resistance of a parasitic resistor of a signal line). A detailed description thereof is described later.

According to some example embodiments, the compensation circuit 130 may include both an example embodiment including the above-described power compensation resistor and an example embodiment including a compensation resistor. In other words, the compensation circuit 130 may maintain the Joule heat supplied to the phase change material constant, maintain the magnitude of the cell current without being dependent on a parasitic resistance value constant, and maximize a magnitude of the Joule heat generated in the cell resistor. A detailed description thereof is described later.

Figure 2:
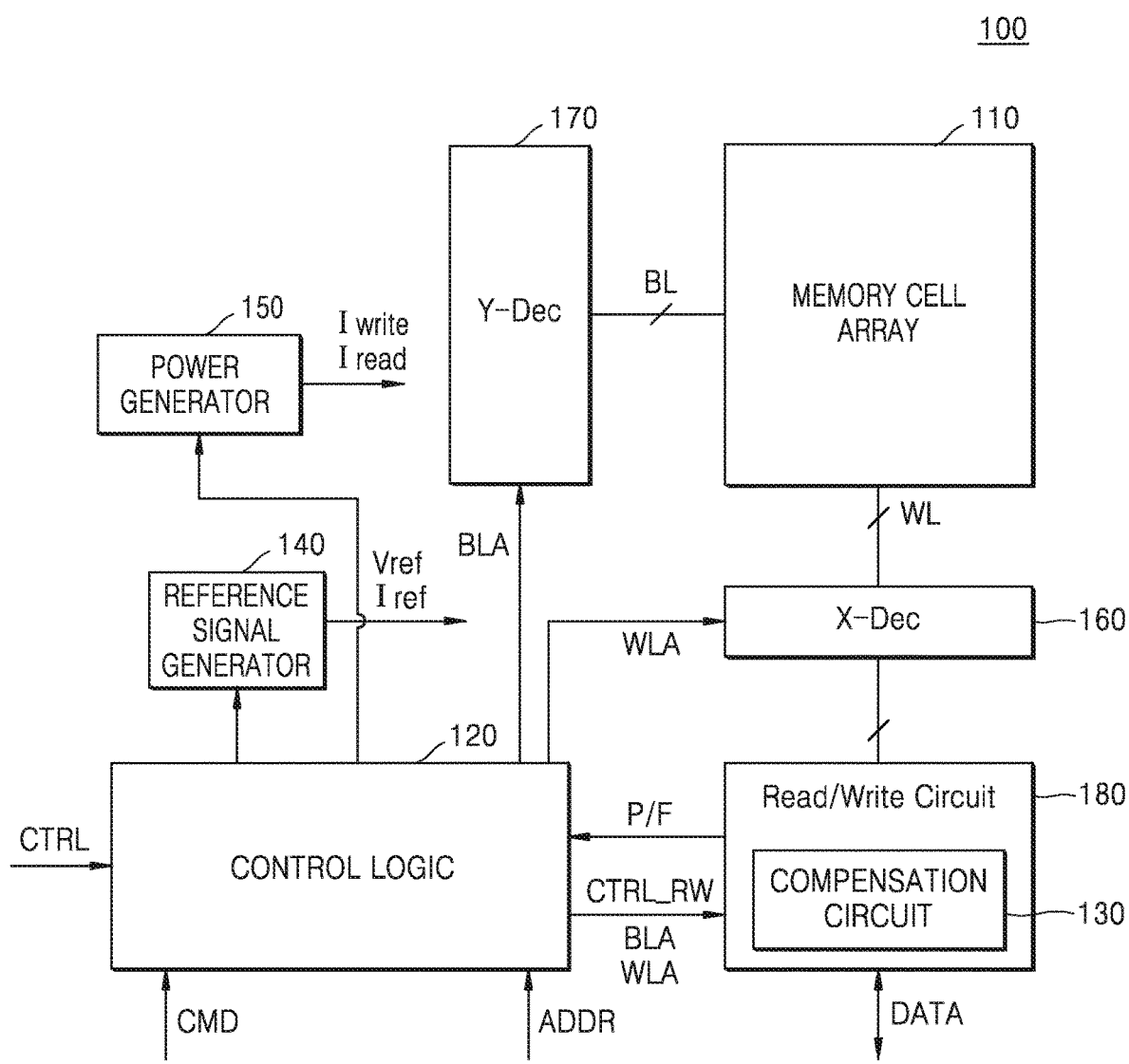
FIG. 2 is a block diagram illustrating in detail a memory device included in the memory system of FIG. 1.

FIG. 2 is a block diagram illustrating in detail the memory device 100 included in the memory system 10 of FIG. 1.

Referring to FIG. 2, the memory device 100 may include the memory cell array 110, the control logic 120, the compensation circuit 130, a reference signal generator 140, a power generator 150, a row decoder 160, a column decoder 170, and a write/read circuit 180. Hereinafter, components included in the memory device 100 are described in detail.

The memory cells included in the memory cell array 110 may be connected to the plurality of first signal lines and the plurality of second signal lines. As an example, the plurality of first signal lines may be word lines WL and the plurality of second signal lines may be bit lines BL, and one or more first signal lines (word lines WL) may be connected to a first terminal of each memory cell in the memory cell array 110, and one or more second signal lines (bit lines BL) may be connected to a second terminal of each memory cell in the memory cell array 110. As various voltage signals or current signals are provided via the plurality of word lines WL and the plurality of bit lines BL, data may be written to or read from the selected memory cells, while writing to or reading from other non-selected memory cells may be prevented.

According to some example embodiments, the address ADDR for indicating the memory cell to be accessed may be received along with the command CMD, and the address ADDR may include a row address WLA for selecting the word lines WL of the memory cell array 110 and may include a column address BLA for selecting the bit lines BL of the memory cell array 110. The address ADDR provided to the memory device 100 may correspond to a physical address that is converted in the memory system corresponding to a logical address from the host HOST. The row decoder 160 may perform a word line selection operation in response to the row address WLA, and the column decoder 170 may perform a bit line selection operation in response to the column address BLA.

The write/read circuit 180 may be connected to the first signal lines and/or the second signal lines of the memory cell array 110 to write data to or read data from the memory cells (in FIG. 2, an example is illustrated in which the write/read circuit 180 is connected to the word lines WL).

The power generator 150 may generate a current or a voltage applied across the memory device 100 according to a control of the control logic 120, and transfer the generated current or voltage to each component of the memory device 100. For example, the power generator 150 may generate a write current $I_{write}$ used for a write operation and in addition, may generate a read current $L_{read}$ used for a read operation. The write current $I_{write}$ may include a set current, a reset current, and the like as various currents related to the write operation. The write current $I_{write}$ and the read current $L_{read}$ may be provided to the bit lines BL via the column decoder 170 and to the word lines WL via the row decoder 160, respectively. For example, when the variable resistive element included in the memory cell is a phase change material, the write current $I_{write}$ may include the reset current and the set current. In one example, the reset current may be a pulse current that changes the phase change material to the amorphous state (high resistance) and may have a current value greater than the set current, and the set current may be a pulse current that changes the phase change material to the crystalline state (low resistance). In addition, the power generator 150 may generate a power voltage $V_{pp}$, and may generate and apply the power voltage $V_{pp}$ of a different magnitude to each memory cell according to the control of the control logic 120.

According to some example embodiments, the reference signal generator 140 may generate a reference voltage Vref and a reference current $I_{ref}$ as various reference signals related to a data read operation. For example, the read circuit 181 may be connected to one node (for example, a sensing node) of the bit line BL to differentiate data DATA, and a value of the data DATA may be differentiated by an operation of comparing a voltage of the sensing node with the reference voltage Vref. Alternatively, when a current sensing method is applied, the reference signal generator 140 may generate the reference current $I_{ref}$ and provide the generated reference current $I_{ref}$ to the memory cell array 110, and the value of the data DATA may be differentiated by comparing the voltage of the sensing node due to the reference current $I_{ref}$ with the reference voltage Vref.

In addition, the write/read circuit 180 may provide to the control logic 120 a pass/fail signal P/F according to a result of the differentiation of the read data DATA. The control logic 120 may control the write and read operations of the memory cell array 110 by referring to the pass/fail signal P/F.

The control logic 120 may output various control signals CTRL_RW to write data to the memory cell array 110 or read data from the memory cell array 110 based on the command CMD, the address ADDR, and the control signal CTRL that are received from the memory controller 200. Thus, the control logic 120 may control all the various operations in the memory device 100.

According to some example embodiments, the control logic 120 may control the power generator 150 to apply the power voltages Vpp different from each other to each memory cell based on the address ADDR received from the memory controller 200. For example, the power generator 150 may generate a first voltage $V_{pp}$, as described herein, and apply same to a selected memory cell based on a cell address (e.g., an address of the selected memory cell) received from the control logic 120. For example, since a significant voltage drop occurs as a distance between the power generator 150 and the selected memory cell increases, a magnitude of a voltage applied to the memory cell (for example, $V_{pp}$ in FIG. 4) may be increased. In other words, the control logic 120 may control the power generator 150 to apply a relatively high voltage when a first memory cell, which has a long distance from a node of a voltage applied to the memory cell array 110 from the power generator 150, is selected. To the contrary, the control logic 120 may control the power generator 150 to apply a relatively low voltage when a second memory cell, which has a short distance from the node of the voltage applied to the memory cell array 110 from the power generator 150, is selected.

The compensation circuit 130 may be electrically connected to the memory cell array 110. According to some example embodiments, the compensation circuit 130 may receive the column address BLA and the row address WLA to identify what one memory cell selected by the memory controller 200 is. A magnitude of the parasitic resistance included in the first signal line (for example, the word line WL) and the second signal line (for example, the bit line BL) may be calculated based on the address ADDR of the selected memory cell. In some example embodiments, the compensation circuit 130 may include the compensation resistor. The compensation circuit 130 may adjust a magnitude of a compensation resistance according to the magnitude of the calculated parasitic resistance so that a value of the cell current flowing in the selected memory cell is not dependent on the parasitic resistance value.

Although the compensation circuit 130 is illustrated as being included in the write/read circuit 180, in some example embodiments, the compensation circuit 130 may be configured separately from the write/read circuit 180 and include all components electrically directly/indirectly connected to the memory cell array 110.

Figure 3A:
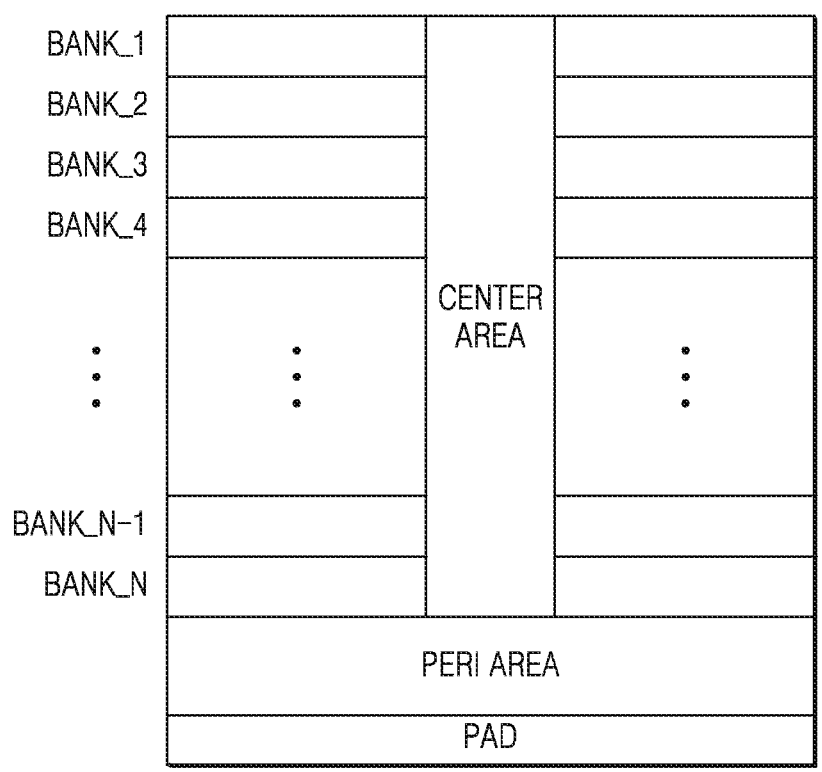
FIGS. 3A through 3D are diagrams illustrating a memory device, a memory bank, a bay, and a tile, respectively, according to some example embodiments.
Figure 3A:
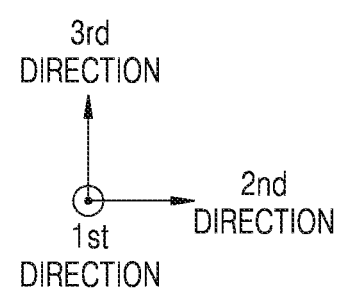

FIG. 3A is a diagram illustrating a memory device 100 according to some example embodiments.

According to some example embodiments, the memory device 100 may have a cell-on-peri (or cell-over-peri) (COP) structure in which the memory cell array 110 and a peripheral circuit are arranged in a lamination direction (a third direction).

The memory device 100 may include a pad, a peri area, a center area, and first through $N^{th}$ memory banks Bank_1 through Bank_N. The peri area may be laminated on the pad in the third direction, and the first through $N^{th}$ memory banks Bank_1 through Bank_N may be laminated on the peri area in the third direction.

The pad may provide an electrical connection to the outside of the memory device 100, and the peri area may include various peripheral circuits for an operation of the memory device 100. The center area may transfer electrical signals generated from the peripheral circuits of the peri area to the memory cells. The center area may include a bank control logic (not shown) controlling the first through $N^{th}$ memory banks Bank_1 through Bank_N.

The memory cell array 110 may include the first through $N^{th}$ memory banks Bank_1 through Bank_N. A detailed structure of the memory cell array 110 is to be described later.

Figure 3B:
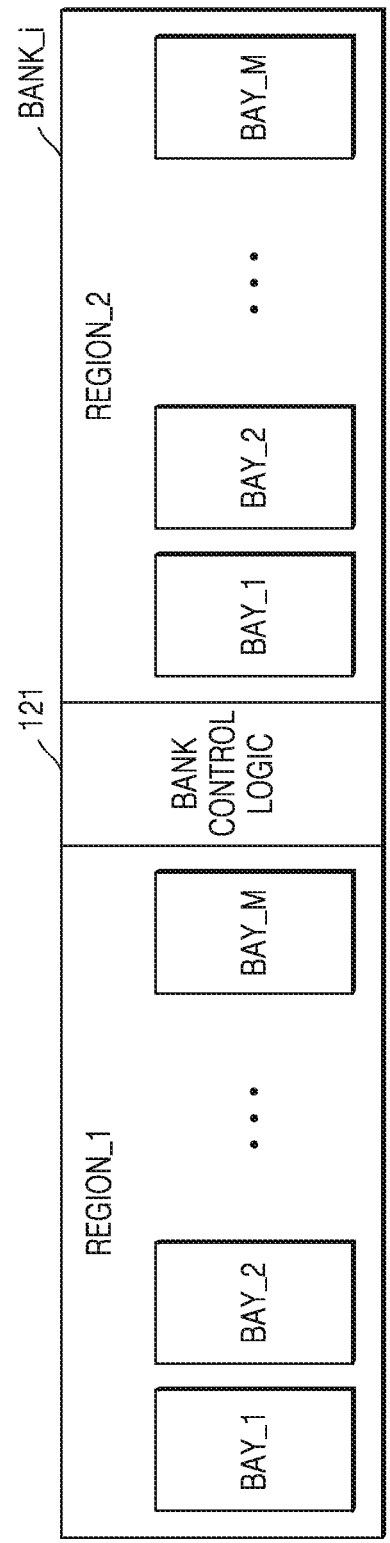

FIG. 3B is a diagram illustrating an $i^{th}$ memory bank Bank_i according to some example embodiments. In this case, the $i^{th}$ bank Bank_i may include a plurality of regions, for example, two regions. In addition, one region may include first through $M^{th}$ bays Bay_1 through Bay_M, for example, 64 or M bays. A bank control logic 121 may be included in the center area in FIG. 3A and control the first through $N^{th}$ memory banks Bank_1 through Bank_N.

Figure 3C:
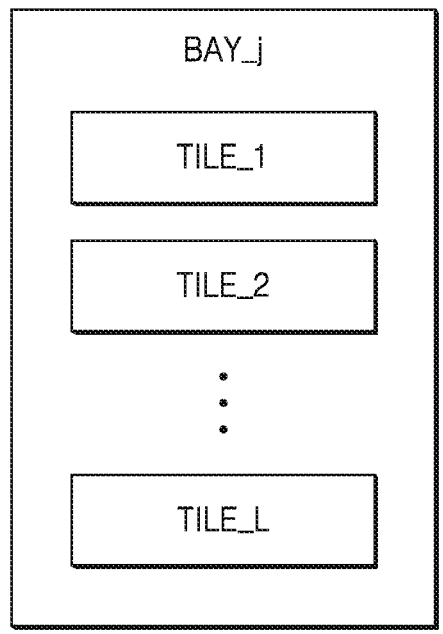

FIG. 3C is a diagram of an $i^{th}$ bay Bay_i according to some example embodiments. One bay or the $i^{th}$ bay Bay_i may include first through $L^{th}$ tiles Tile_1 through Tile_L, for example, 4 tiles. Each of the first through $L^{th}$ tiles Tile_1 through Tile_L may include the plurality of memory cells.

Figure 3D:
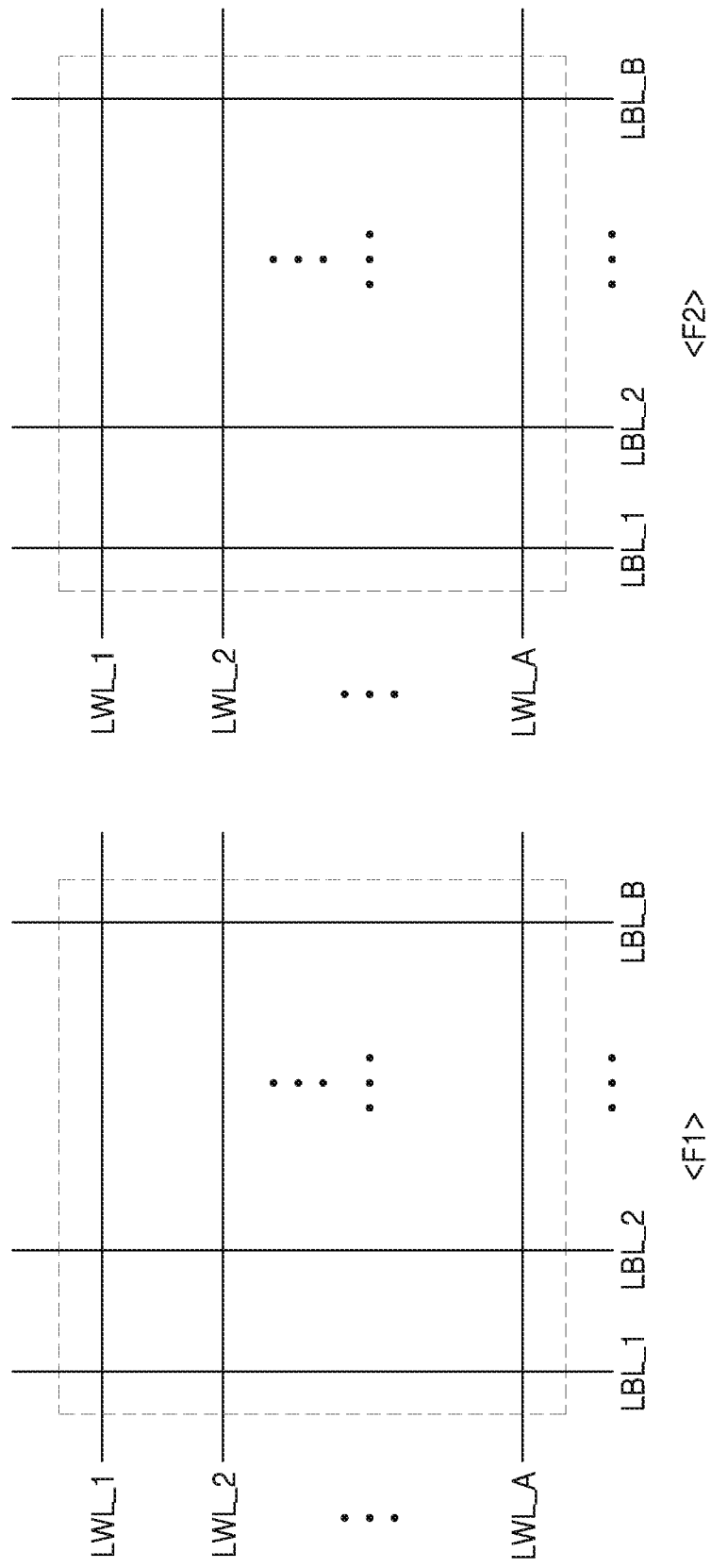

FIG. 3D is a diagram illustrating a tile according to some example embodiments. The tile of FIG. 3D may illustrate one of the first through $L^{th}$ tiles Tile_1 through Tile_L in FIG. 3C. The tile may be a resistive memory of a three-dimensional structure having a plurality of layers. For example, the tile may include a first floor F1 and a second floor F2. Each of the first and second floors F1 and F2 may include the memory cell array 110 including memory cells which are located in the regions where the plurality of word lines and the plurality of bit lines cross each other.

According to some example embodiments, the compensation circuit 130 may be provided to correspond to each of the bays BAY. In other words, the compensation circuit 130 may adjust the cell current applied to the memory cell selected by the memory controller 200 in each bay BAY. In one example, the compensation circuit 130 may control the power consumed in one memory cell selected in one bay BAY by adjusting a power correction resistance value. In another example, the compensation circuit 130 may calculate the parasitic resistance value distributed in the first signal line and the second signal line based on the address ADDR corresponding to the selected memory cell, and based thereon, may adjust the value of the compensation resistance (e.g., the magnitude of resistance of a compensation resistor) so that the cell current that is not dependent on the parasitic resistance value and flows in the selected memory cell. However, the technical idea of the inventive concepts are not limited thereto, and it is needless to say that the compensation circuit 130 may be implemented as one memory cell, one tile, one region, or one bank unit.

Figure 4:
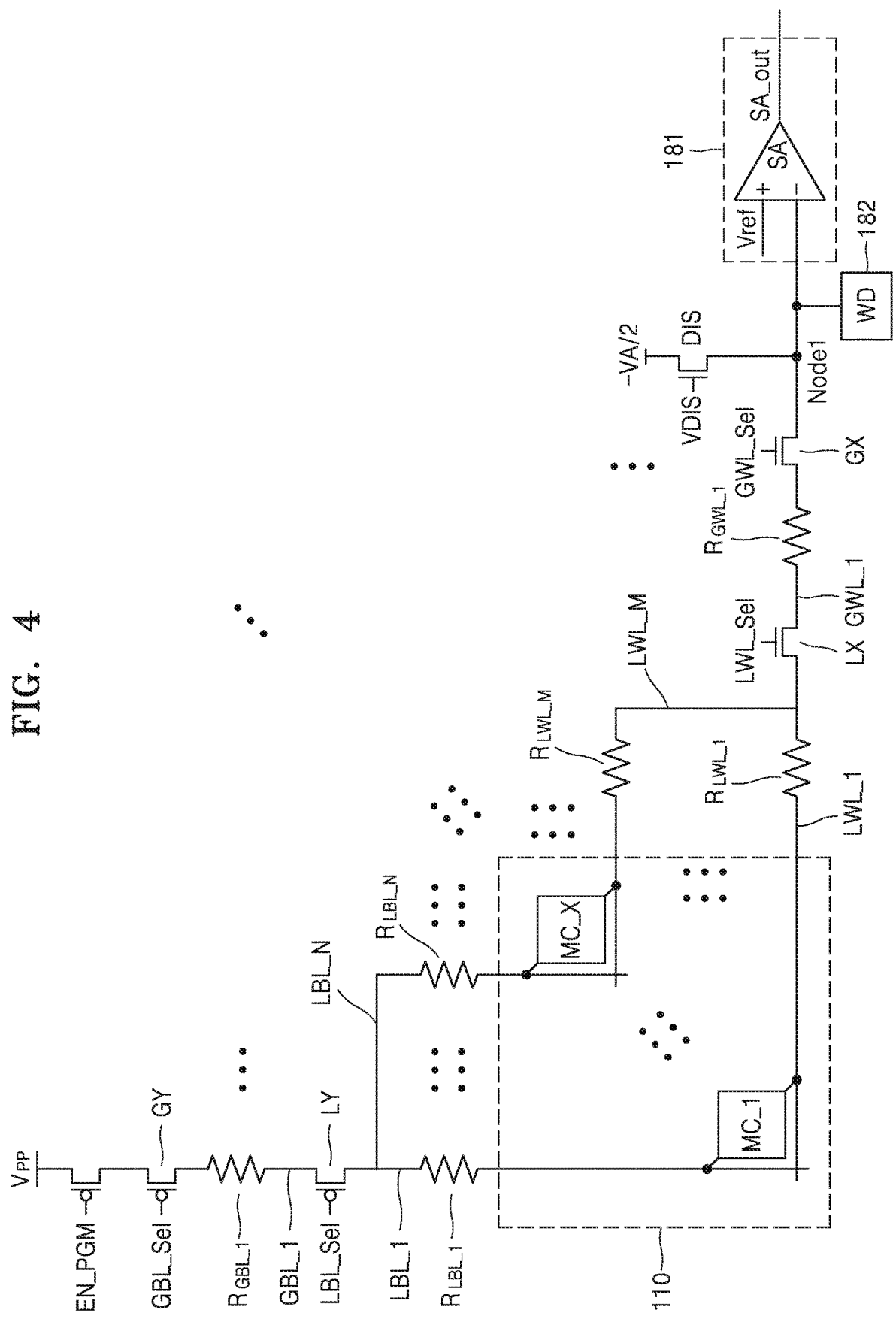
FIG. 4 is a diagram illustrating a memory cell array and signal lines connected thereto according to some example embodiments.

FIG. 4 is a diagram illustrating the memory cell array 110 and signal lines connected thereto according to some example embodiments.

According to some example embodiments, the memory cell array 110 including first through $X^{th}$ memory cells MC_1 through MC_X may be connected to the signal lines. The memory cell MC may be connected to the bit line BL and the word line WL, and the bit line BL may include a plurality of global bit lines GBL_1 and first through $N^{th}$ local bit lines LBL_1 through LBL_N, and the word line WL may include a plurality of global word lines GWL_1 and first through $M^{th}$ local word lines LWL_1 through LWL_M. For convenience of explanation, only one global bit line GBL_1 and only one global word line GWL_1 are illustrated, but the global bit line GBL_1 and the global word line GWL_1 may be implemented in plural. Accordingly, as shown in FIG. 4, a first signal line (word line WL) may be connected to a first terminal of each of the first through $X^{th}$ memory cells MC_1 through MC_X and a second signal line (bit line BL) may be connected to a second terminal of the each of the first through $X^{th}$ memory cells MC_1 through MC_X.

According to some example embodiments, the memory device 100 may initiate the write and/or read operation when a program enable signal EN_PGM for initiating data write and/or read is applied. When a global bit line selection signal GBL_Sel or a local bit line selection signal LBL_Sel is applied, the column decoder (for example, 170 in FIG. 2) may select any one of the first through Nth local bit lines LBL_1 through LBL_N, for example, the first local bit line LBL_1. In addition, when a global word line selection signal GWL_Sel or a local word line selection signal LWL_Sel is applied, the row decoder 160 may select any one of the first through Mth local word lines LWL_1 through LWL_M, for example, the first local word line LWL_1. For example, bit line selection elements (GY and LY) may be implemented as p-type metal-oxide-semiconductor (PMOS) and word line selection elements (GX and LX) may be implemented as n-type metal-oxide-semiconductor (NMOS). However, the example embodiments are not limited thereto.

According to some example embodiments, the control logic 120 may select a particular memory cell, for example, the first memory cell MC_1, and the write/read circuit 180 may write and/or read the data of the selected first memory cell MC_1 and may not perform the write and/or read operation for other memory cells, for example, the X$^{th}$ memory cell MC_X. For example, when a first voltage V$_{pp}$ for performing the write and/or read operation is applied to the global bit line GBL_1, the cell current may be applied to the first memory cell MC_1 via the global bit line GBL_1 and the first local bit line LBL_1. The cell current may pass through the first local word line LWL_1 and the global word line GWL_1.

According to some example embodiments, each signal line may include parasitic resistance. The parasitic resistance may include a bit line parasitic resistance and a word line parasitic resistance. The bit line parasitic resistance may include a global bit line parasitic resistance R$_{GBL\_1}$ and first through N$^{th}$ local bit line parasitic resistances R$_{LBL\_1}$ through R$_{LBL\_N}$. The global word line parasitic resistance may include a global word line parasitic resistance R$_{GWL\_1}$ and first through M$^{th}$ local word line parasitic resistances R$_{LWL\_1}$ through R$_{LWL\_M}$. Each parasitic resistance value of the bit line may increase as a length of the signal line of the bit line increases. For example, since the first local bit line LBL_1 is longer than the N$^{th}$ local bit line LBL_N, the first local bit line parasitic resistance R$_{LBL\_1}$ may be greater than the N$^{th}$ local bit line parasitic resistance R$_{LBL\_N}$. Each parasitic resistance value of the word line may also increase as a length of the signal line of the word line increases. Thus, even when the same first voltage V$_{pp}$ set for the write and/or read operation is applied to the bit line, the cell current flowing in each of the plurality of memory cells may be different from each other. For example, when the memory cell MC includes a phase change material, a reset, set or read current applied to the first memory cell MC_1 may be less than the reset, set or read current applied to the X$^{th}$ memory cell MC_X, respectively. The compensation circuit 130 may supply a uniform cell current to each memory cell MC by using the compensation resistor (e.g., adjusting a magnitude of resistance of the compensation resistor) to prevent the cell current from varying depending on a position of each memory cell. It will be understood that a "magnitude of resistance" of an element (e.g., compensation resistor) may be referred to interchangeably as a "resistance value" of the element.

According to some example embodiments, the write/read circuit 180 may include a read circuit 181 and a write circuit 182. The read circuit 181 may output an output value SA_out of a sense amplifier by amplifying a difference value between the reference voltage Vref and a voltage of a first node Node1. In addition, in a free charge interval of the bit line or the word line, the voltage of the first node Node1 may be the same as the reference voltage Vref as a discharge transistor DIS is turned off. The write circuit 182 may write data into the memory cell array 110 according to the control of the control logic 120, and as an example, may perform a write operation by generating the set current L$_{set}$ or the reset current I$_{reset}$.

Figure 5A:
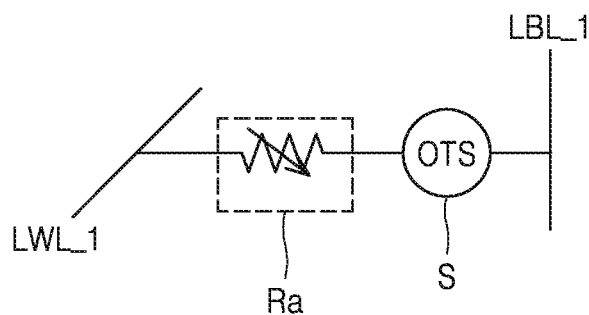
FIGS. 5A and 5B are diagrams respectively illustrating memory cells according to some example embodiments.
Figure 5B:
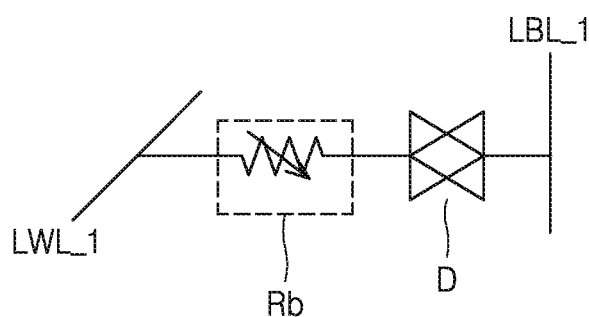

FIGS. 5A and 5B are diagrams respectively illustrating memory cells MCa and MCb according to some example embodiments.

According to FIG. 5A, the memory cell MCa may include a cell resistor Ra and a selection element S. For example, each of the first through X$^{th}$ memory cells MC_1 through MC__X illustrated in FIG. 4 may be implemented as the memory cell MCa. Here, the cell resistor Ra may be referred to as a variable resistance element or a variable resistance material, and the selection element S may be referred to as a switching element.

In some example embodiments, the cell resistor Ra and the selection element S may be connected between one of the first through N$^{th}$ local bit lines LBL_1 through LBL_N and one of the first through M$^{th}$ local word lines LWL_1 through LWL_M.

The variable resistor Ra may have one of a plurality of resistance states due to an applied electrical pulse. In some example embodiments, the variable resistor Ra may include a phase change material in which a crystal state changes with the magnitude of the cell current. The phase change material may include various kinds of materials such as GaSb, InSb, InSe, Sb2Te3, and GeTe each combining 2 elements, GeSbTe, GaSeTe, InSbTe, SnSb2Te4, and InSbGe each combining 3 elements, and AgInSbTe, (GeSn)SbTe, GeSb(SeTe), and Te81Ge15Sb2S2 each combining 4 elements.

The phase change material may have an amorphous state of relatively high resistance and a crystalline state of relatively low resistance. The phase change material may have a phase change due to the Joule heat that is generated according to the magnitude of the cell current. In addition, data may be written by using the phase change.

The selection element S may control a current supply to the variable resistor Ra according to the voltage applied to the local word line and the local bit line. As an example, the selection element S may include an Ovonic threshold switch OTS. The Ovonic threshold switch may include arsenic (As), germanium (Ge), selenium (Se), tellurium (Te), silicon (Si), bismuth (Bi), and antimony (Sb). In particular, a six-element system material may be prepared in which Se and sulfur (S) are added to a composite including Ge, Si, As, and Te.

According to some example embodiments, according to FIG. 5B, the memory cell MCb may include a variable resistor Rb and a selection element D.

In one example, the variable resistor Rb may include the phase change material as well as perovskite compounds, transition metal oxide, magnetic materials, ferromagnetic materials, or anti-ferromagnetic materials. According to some example embodiments, the selection element D may include a bidirectional diode. In another example, the selection device D may include a PN junction diode, a PIN junction diode, and a selection transistor.

Figure 6A:
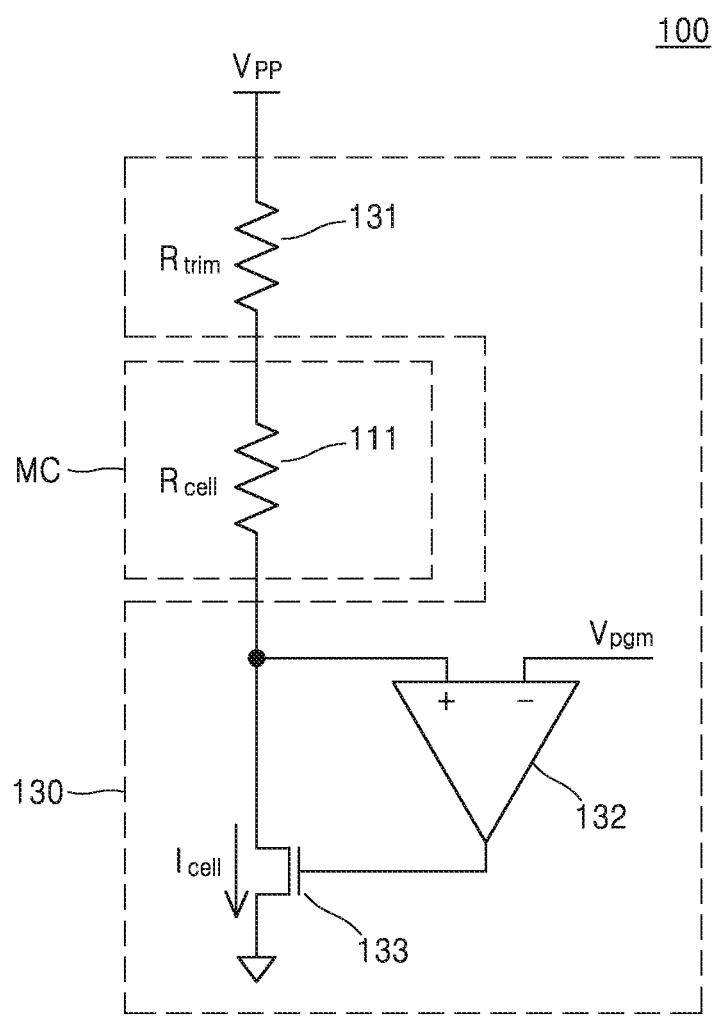
FIG. 6A is a diagram illustrating a compensation circuit including a power compensation resistor according to some example embodiments.

FIG. 6A is a diagram illustrating the compensation circuit 130 including a power compensation resistor 131 according to some example embodiments.

According to some example embodiments, the compensation circuit 130 may include the power compensation resistor 131, an operational amplifier 132, and a transistor 133, the memory cell MC may include a cell resistor 111, and the cell resistor 111 may include a phase change material in which the crystal state changes according to a current magnitude. According to some example embodiments, unlike the compensation circuit 130 in FIG. 6A, the power compensation resistor 131 may not be included in the compensation circuit 130, but may be designed to be included in the signal line.

The compensation circuit 130 may be supplied with a voltage for writing and/or reading data. For example, the first voltage V$_{PP}$ may be applied to a first end of the cell resistor 111 and the power compensation resistor 131 from the outside of the compensation circuit 130, for example the power generator 150, and a second voltage V$_{pgm}$ may be applied to a first input terminal (for example, an inverting input terminal) of the operational amplifier 132 from the outside of the compensation circuit 130, for example the power generator 150. In this case, the same second voltage V$_{pgm}$ may be applied to a second input terminal (for example, a non-inverting input terminal) by a virtual short principle of the operational amplifier 132. Thus, the second voltage $V_{pgm}$ may be applied in a direction opposite to the first end of the cell resistor 111. Accordingly, the cell current that is obtained by dividing the difference between the first voltage $V_{PP}$ and the second voltage $V_{pgm}$ by a sum of resistances of the cell resistor 111 and the power compensation resistor 131 may be applied to the memory cell MC. In addition, power may be supplied to the memory cell MC according to the cell current, and the supplied power may cause the phase change by applying the Joule heat to the phase change material. The cell current and the supplied power may be expressed by Formula 1 below.

$$I_{cell} = \frac{V_{pp} - V_{pgm}}{R_{cell} + R_{trim}} \qquad \text{[Formula 1]}$$

$$P_{cell} = I_{cell}^2 * R_{cell} = \frac{(V_{pp} - V_{pgm})^2 * R_{cell}}{(R_{cell} + R_{trim})^2}$$

In Formula 1, $I_{cell}$ is the cell current, $R_{cell}$ is the resistance of the cell resistor 111, $P_{cell}$ is the power supplied to the cell resistor 111, $R_{trim}$ is the resistance ("magnitude of resistance") of the power compensation resistor 131, $V_{PP}$ is the first voltage, and $V_{pgm}$ is the second voltage.

In this case, the compensation circuit 130 may supply uniform power to the cell resistor 111 regardless of the resistance value of the cell resistor 111 included in the memory cell MC, and may generate uniform Joule heat in the cell resistor 111. According to some example embodiments, the resistance value of the cell resistor 111 may have one of values in a certain range. The reason is that the cell resistor 111 is a variable resistive element. In this case, the value ("magnitude of resistance," "resistance value," etc.) of the power compensation resistor 131 may have the resistance value of a case when power at a minimum resistance value of the cell resistor 111 and power at a maximum resistance value of the cell resistor 111 are the same. For example, the cell resistor 111 may have a total resistance of the plurality of memory cells, or resistance of the selected memory cell. $R_{trim}$ may be expressed as Formula 2 below. Here, $R_{cell\_min}$ may denote the minimum resistance value of the cell resistor 111 in the certain range, and $R_{cell\_max}$ may denote the maximum resistance value of the cell resistor 111 in the certain range.

$$P_{Rcell\_min} = P_{Rcell\_max} \qquad \text{[Formula 2]}$$

$$\frac{(V_{pp} - V_{pgm})^2 * R_{cell\_min}}{(R_{cell\_min} + R_{trim})^2} = \frac{(V_{pp} - V_{pgm})^2 * R_{cell\_max}}{(R_{cell\_max} + R_{trim})^2}$$

$$\therefore R_{trim} = \sqrt{R_{cell\_min} * R_{cell\_max}}$$

Figure 6B:
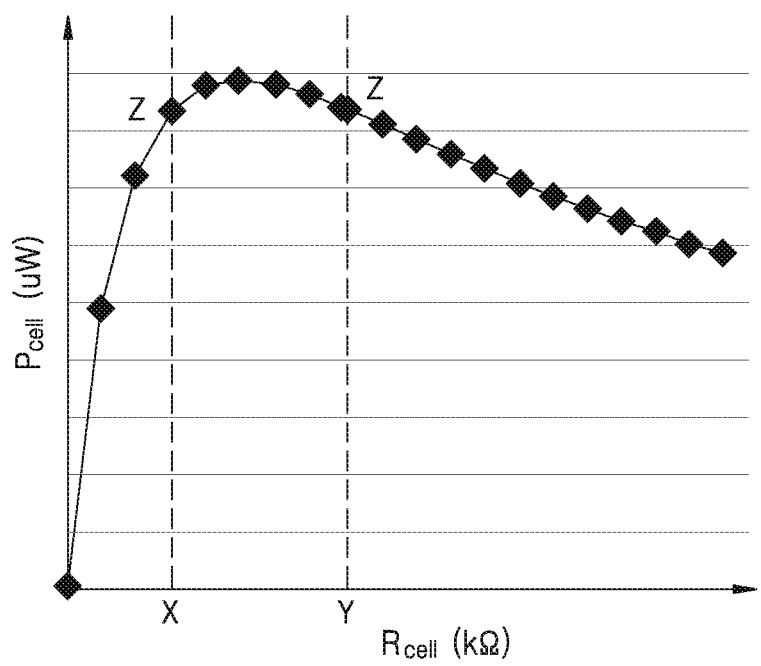
FIG. 6B is a graph illustrating power supplied to a cell resistor according to cell resistance in FIG. 6A.

Thus, the power compensation resistor 131, which may correspond to each memory cell MC of a plurality of memory cells MC, may have a resistance value based on the resistance value of the cell resistor 111. Restated, in some example embodiments, a magnitude of resistance of the power compensation resistor 131 may be proportional to a magnitude of resistance of a selected memory cell MC (i.e., the magnitude of resistance of the cell resistors 111 of the selected memory cell MC), such that the magnitude of resistance of the power compensation resistor 131 increases as the magnitude of resistance of the selected memory cell MC (e.g., the cell resistance value of the selected memory cell MC) increases. For example, the resistance value of the power compensation resistor 131 may be determined by a geometric mean of the minimum and maximum resistance values of the cell resistor 111, and the minimum and maximum resistance values of the cell resistor 111 may be the resistance value when the power supplied to the cell resistor 111 is the same. FIG. 6B is referenced in this regard. Accordingly, the power compensation resistor 131 may have a resistance value ("magnitude of resistance") that is greater than the minimum resistance value ("minimum magnitude of resistance") of a selected memory cell MC and less than the maximum resistance value ("maximum magnitude of resistance") of the selected memory cell MC.

As shown in FIG. 6A, the power compensation resistor 131 and the selected memory cell MC may be connector to each other in series, and the power generator 150 (e.g., source of the first voltage $V_{pp}$) may be connected in series to the power compensation resistors 131 and the selected memory cell MC, and the first voltage Vpp may be proportional to (e.g., may increase in proportion to) a magnitude of resistance of a parasitic resistor connected to the selected memory cell MC.

FIG. 6B is a diagram illustrating power supplied to the cell resistor 111 according to the cell resistance in FIG. 6A. The horizontal axis may represent the resistance value of the cell resistor 111 and the vertical axis may represent the power supplied to the cell resistor 111.

Referring to FIG. 6B, the resistance value ("magnitude of resistance") of the power compensation resistor 131 may be determined such that power $P_{cell}$ supplied by the cell current has a certain value according to some example embodiments. For example, the certain value of the supplied power $P_{cell}$ may be Z.

In addition, the cell resistor 111 may have a resistance value in the certain range and may have, for example, the resistance value of X to Y as illustrated in FIG. 6B. In this case, a power compensation resistance (e.g., "a magnitude of resistance" of the power compensation resistor 131, "resistance value" of the power compensation resistor 131, etc.) may be determined to have the geometric mean of the minimum and maximum resistance values in the certain range of the cell resistor 111 (e.g., the magnitude of resistance of a selected memory cell MC), such that the power compensation resistance ("magnitude of resistance" of the power compensation resistor 131, "resistance value" of the power compensation resistor 131, etc.) is greater than the minimum cell resistance value associated with the cell resistor 111 and less than the maximum cell resistance value associated with the cell resistor 111. Accordingly, a resistance value of the power compensation resistor 131 may be based on a cell resistance value of the selected memory cell MC (e.g., a resistance value of the cell resistor 111). As described above, when the resistance value of the power compensation resistor 131 is determined, the power supplied to the cell resistor 111 may not greatly change and may be stably supplied, even when the resistance value of the cell resistor 111 changes in the certain range. Accordingly, a compensation circuit 130 may control the power ($P_{cell}$) that is supplied to a memory cell MC based on adjusting a resistance value ("magnitude of resistance") of the power compensation resistor 131.

Referring again to FIG. 6A, in the operational amplifier 132, for example, an output voltage source and an output resistor may be connected to each other in series to an output terminal. As another example, the inside of the operational amplifier 132 may be implemented as an operational transconductance amplifier (OTA) in which an output current source and the output resistor are connected to each other in parallel to the output terminal. A gate terminal of the transistor 133 may be connected to the output terminal of the operational amplifier 132, and the cell resistor 111 and the transistor 133 may be connected to each other so that the cell current $I_{cell}$ flows through a drain terminal and a source terminal of the transistor 133.

According to some example embodiments, the compensation circuit 130 may adjust the power supplied to the memory cell MC by adjusting the resistance value of the power compensation resistor 131, and accordingly, may adjust the Joule heat generated in the memory cell MC. The compensation circuit 130 may adjust the resistance value of the cell resistor 111 by changing a state of the cell resistor 111 by adjusting the Joule heat. Accordingly, the power supplied to one or more memory cells MC and a state of a phase change material of the memory cells MC (e.g., a phase change material of the cell resistor 111) may be based on the resistance value ("magnitude of resistance") of the power compensation resistor 131.

Figure 7:
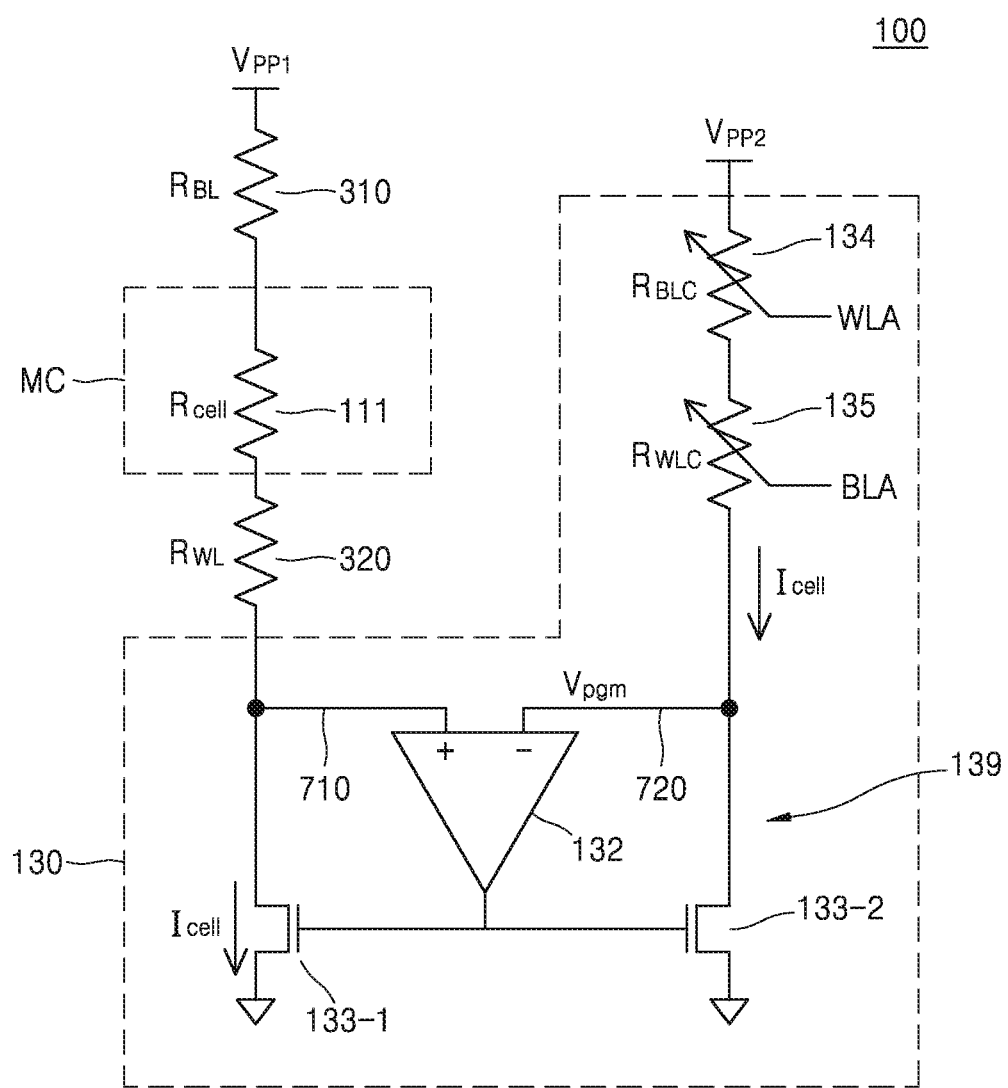
FIG. 7 is a diagram illustrating a compensation circuit including compensation resistors according to some example embodiments.

FIG. 7 is a diagram illustrating the compensation circuit 130 including compensation resistors according to some example embodiments.

According to some example embodiments, the memory device 100 may include the memory cell MC, a bit line parasitic resistor 310, a word line parasitic resistor 320, and the compensation circuit 130, the memory cell MC may include the cell resistor 111, and the compensation circuit 130 may include the operational amplifier 132, a first transistor 133-1, a second transistor 133-2, a first compensation resistor 134, and a second compensation resistor 135. Accordingly, as indicated above, a parasitic resistor (310 and/or 320) may be included in at least one signal line of a first signal line (word line WL) and a second signal line (bit line BL).

Referring to FIG. 7, the compensation circuit 130 may compensate for a leak current due to a bit line parasitic resistor 310 and a word line parasitic resistor 320 by including the compensation resistors (including the first compensation resistor 134 and the second compensation resistor 135). Accordingly, each compensation resistor (first compensation resistor 134 and second compensation resistor 135) may be configured to compensate for a voltage drop generated in the respective parasitic resistor of at least one signal line (parasitic resistor 310 and/or parasitic resistor 320) to the memory cells MC.

According to some example embodiments, a first voltage $V_{pp1}$ and a second voltage $V_{pp2}$ for writing and/or reading data to/from the memory cell MC may be supplied from the outside of the memory device 100 to the bit line BL and the compensation circuit 130. In addition, the same voltage $V_{pgm}$ may be applied to the inverting input terminal and the non-inverting input terminal of the operational amplifier 132 by the first voltage $V_{pp1}$ (as a first node voltage) and the second voltage $V_{pp2}$ (that is a second node voltage) according to the virtual short principle. Accordingly, it will be understood that a voltage (e.g., the second voltage $V_{pp2}$) may be applied to one or more memory cells MC via an input terminal of the operational amplifier 132 (e.g., the non-inverting input terminal of the operational amplifier 132).

In this case, the value of the cell current $I_{cell}$ may be derived by using a mesh equation based on Kirchhoff's voltage law. The mesh equation may be an equation based on a mesh which passes through a terminal for the first voltage $V_{pp1}$, the bit line parasitic resistor 310, the cell resistor 111, the word line parasitic resistor 320, the non-inverting input terminal and the inverting input terminal of the operational amplifier 132, the second compensation resistor 135, the first compensation resistor 134, and a terminal for the second voltage $V_{pp2}$. In this case, the cell current $I_{cell}$ may flow through the first transistor 133-1 of a current mirror according to the virtual open principle of the operational amplifier 132, and the mirrored cell current $I_{cell}$ may flow through the second transistor 133-2. Restated, and as shown in FIG. 7, the compensation circuit 130 may include a current mirror 139 configured to generate a current, flowing in the compensation resistor (e.g. the first compensation resistor 134 and the second compensation resistor 135), that is equal in magnitude to the cell current $I_{cell}$. As shown, the first transistor 133-1 of the current mirror 139 is electrically connected to the memory cell MC and the second transistor 133-2 of the current mirror 139 is electrically connected to the first compensation resistor 134 and the second compensation resistor 135. As shown in at least FIG. 7, the gate terminals of the first and second transistor of the current mirror may be connected to the output terminal of the operational amplifier 132, a wire 710 connected to the memory cell MC may be connected to a first input terminal of the operational amplifier 132, and a wire 720 connected to the compensation resistor (e.g., 134 and/or 135) may be connected to a second input terminal of the operational amplifier 132. The cell current $I_{cell}$ may flow through the first compensation resistor 134 and the second compensation resistor 135 according to the virtual open principle of the operational amplifier 132. Accordingly, the mesh equation as shown in Formula 3 below is established. As shown in at least FIG. 7, the operational amplifier 132 may be connected to a second terminal of the memory cells MC (e.g., a terminal that is connected to a second signal line).

$$-V_{pp1} + I_{cell} * R_{BL} + I_{cell} * R_{cell} + \qquad \text{[Formula 3]}$$
$$I_{cell} * R_{WL} - I_{cell} * R_{WLC} - I_{cell} * R_{BLC} + V_{pp2} = 0$$
$$\therefore I_{cell} = \frac{V_{pp1} - V_{pp2}}{R_{cell} + (R_{BL} - R_{BLC}) + (R_{WL} - R_{WLC})}$$

According to some example embodiments, the compensation circuit 130 may receive the address ADDR from the outside and adjust the magnitude of the compensation resistance based thereon. The address ADDR may include the bit line address BLA and the word line address WLA. For example, the compensation circuit 130 may receive the address ADDR and generate information about a certain memory cell MC in which the write and/or read operation is currently performed. In other words, the compensation circuit 130 may calculate the parasitic resistances of the bit line and word line parasitic resistors 310 and 320 included in the bit line BL and the word line WL for the certain memory cell MC.

According to some example embodiments, the compensation circuit 130 according to some example embodiments may adjust the resistance value of the first compensation resistor 134 based on the word line address WLA, and adjust the resistance value of the second compensation resistor 135 based on the bit line address BLA. Restated, the compensation circuit 130 may control a magnitude of resistance of a compensation resistor (e.g., the first and/or second compensation resistors 134, 135) upon receiving an address corresponding to the memory cell (e.g., a world line address and/or a bit line address BLA). For example, the parasitic resistance value included in all bit lines BL connected to the selected word line WL may be obtained based on the word line address WLA, and the parasitic resistance value included in all word lines WL connected to the selected bit line BL may be obtained based on the bit line address BLA. Accordingly, the compensation circuit 130 may obtain the parasitic resistance value of the bit line parasitic resistor 310 included in one bit line BL and the parasitic resistance value of the word line parasitic resistor 320 included in one word line WL selected by the memory controller 200.

According to some example embodiments, the compensation circuit 130 may adjust the magnitude of the compensation resistance based on the parasitic resistance of the signal line connected to the memory cell MC. After the resistance values of the bit line parasitic resistor 310 and the word line parasitic resistor 320 are calculated for the certain memory cell MC, the resistance value of the first compensation resistor 134 may be adjusted to the resistance value of the bit line parasitic resistor 310, and the resistance value of the second compensation resistor 135 may be adjusted to the resistance value of the word line parasitic resistor 320. Restated, the magnitude of resistance ("resistance value") of the first compensation resistor 134 may be adjusted to be equal or substantially equal (e.g., equal within manufacturing tolerances and/or material tolerances) to the magnitude of resistance ("resistance value") of the parasitic resistor 310, and the magnitude of resistance of the second compensation resistor 135 may be adjusted to be equal or substantially equal (e.g., equal within manufacturing tolerances and/or material tolerances) to the magnitude of resistance of the parasitic resistor 320, such that the magnitude of the cell current $I_{cell}$ as indicated in Formula 3 is caused to increase. In this case, the cell current may be expressed by Formula 4 below based on Formula 3.

$$I_{cell} = \frac{V_{pp1} - V_{pp2}}{R_{cell}} \quad \text{[Formula 4]}$$

Thus, the cell current that is independent of the bit line parasitic resistor 310 and the word line parasitic resistor 320 (e.g., the resistance value(s) thereof), and is dependent on the cell resistor 111 (e.g., the cell resistance value of the memory cell MC including the cell resistor 111), the first voltage $V_{pp1}$, and the second voltage $V_{pp2}$, may be applied to the cell resistor 111 of the memory cell MC, which may compensate for a voltage drop and/or current loss generated in one or more of the parasitic resistors 310, 320 of the bit line and/or word line connected to the memory cell MC. In other words, even when the lengths of the bit line and the word line connected to each memory cell MC selected by the memory controller 200 are different from each other, uniform current may be supplied. In addition, when the memory device 100 is implemented as PRAM, uniform cell current may be supplied, thereby improving an operation distribution.

Figure 8:
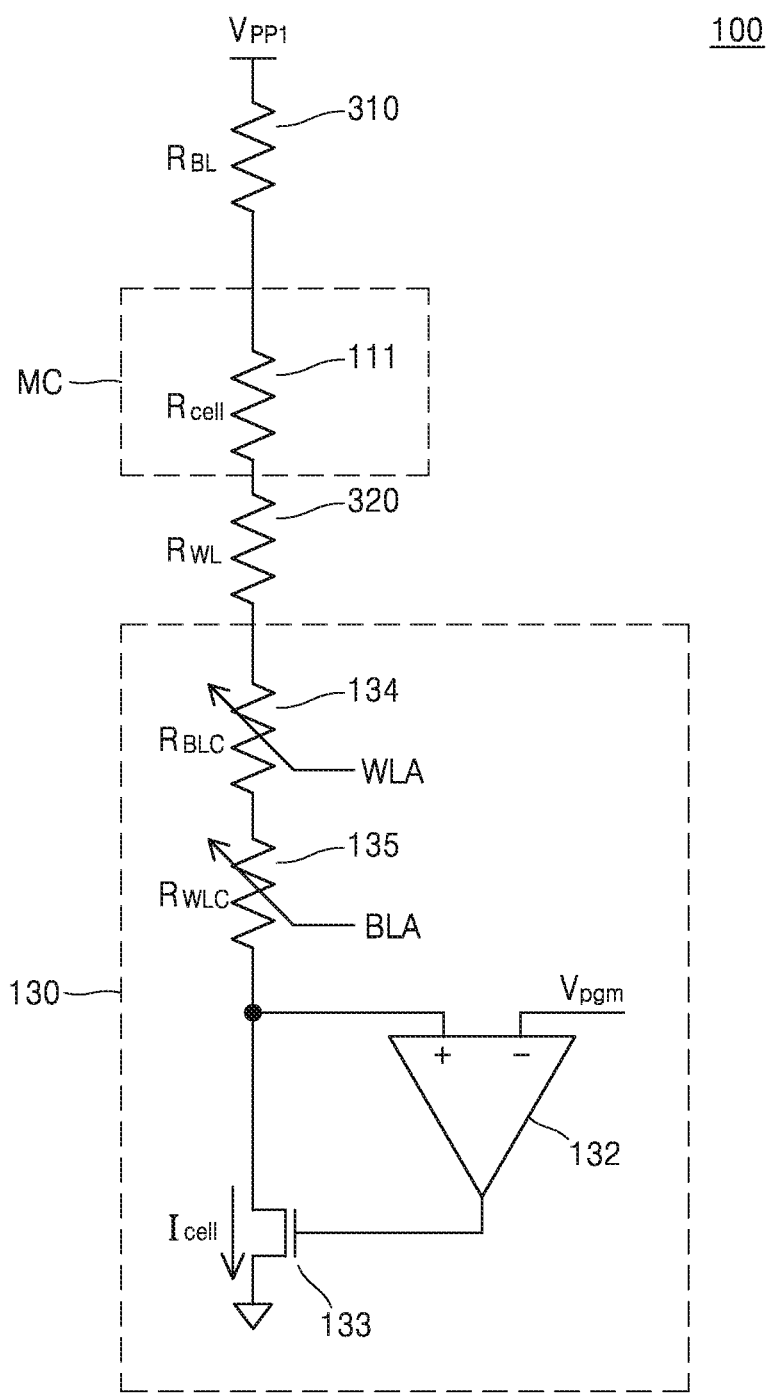
FIG. 8 is a compensation circuit according to some example embodiments.

FIG. 8 is a diagram illustrating the compensation circuit 130 including a structure different from that illustrated in FIG. 7, according to some example embodiments.

According to some example embodiments, the memory device 100 may include the memory cell MC, the bit line parasitic resistor 310, the word line parasitic resistor 320, and the compensation circuit 130, the memory cell MC may include the cell resistor 111, and the compensation circuit 130 may include the operational amplifier 132, a transistor 133, the first compensation resistor 134, and the second compensation resistor 135.

Referring to FIG. 8, unlike FIG. 7, the first and second compensation resistors 134 and 135 may are connected to the word lines WL and the bit lines BL. For example, when a memory cell MC far from a power source of the power voltage $V_{pp}$ applied to the bit line BL is selected, resistance of the bit line parasitic resistor 310 may be increased. For another example, when a memory cell MC far from a terminal from which the cell current $I_{cell}$ is output is selected, resistance of the word line parasitic resistor 320 may be increased.

In this manner, resistances of the bit line parasitic resistor 310 and the word line parasitic resistor 320 may vary according to a position of the selected memory cell MC. When a magnitude of parasitic resistance varies, it may be difficult to output a constant cell current $I_{cell}$, and thus, it is required to adjust resistances ("magnitudes of resistance") of the first and second compensation resistors 134 and 135 based on ("upon receiving") the bit line address BLA and the word line address WLA of the selected memory cell MC.

According to some example embodiments, the compensation circuit 130 may adjust the magnitude of resistance of the first compensation resistor 134 based on ("upon receiving") the word line address WLA such that a total resistance of the bit line parasitic resistor 310 and the first compensation resistor 134 is maintained constant. The compensation circuit 130, based on the word line address WLA, may decrease resistance of the first compensation resistor 134 when resistance of the bit line parasitic resistor 310 of the selected memory cell MC is large, and may increase resistance of the first compensation resistor 134 when resistance of the bit line parasitic resistor 310 of the selected memory cell MC is small.

In addition, the compensation circuit 130 may adjust the magnitude of resistance of the second compensation resistor 135 based on ("upon receiving") the bit line address BLA such that a total resistance of the word line parasitic resistor 320 and the second compensation resistor 135 is maintained constant. The compensation circuit 130 may, based on the bit line address BLA, decrease resistance of the second compensation resistor 135 when resistance of the word line parasitic resistor 320 of the selected memory cell MC is large, and may increase resistance of the second compensation resistor 135 when resistance of the word line parasitic resistor 320 of the selected memory cell MC is small.

Accordingly, the compensation circuit 130 may output the cell current $I_{cell}$ having a constant magnitude regardless of a position of the selected memory cell MC (that is, regardless of resistances of parasitic resistors).

In the example illustrated in FIG. 8, the first compensation resistor 134 and the second compensation resistor 135 are connected to each other in series, but this is only an example equivalent circuit. Even when the first and second compensation resistors 134 and 135 are connected to each other in parallel while being connected between the word line parasitic resistor 320 and a non-inverting input terminal of the operational amplifier 132, the technical aspect of the inventive concepts is applicable.

Figure 9:
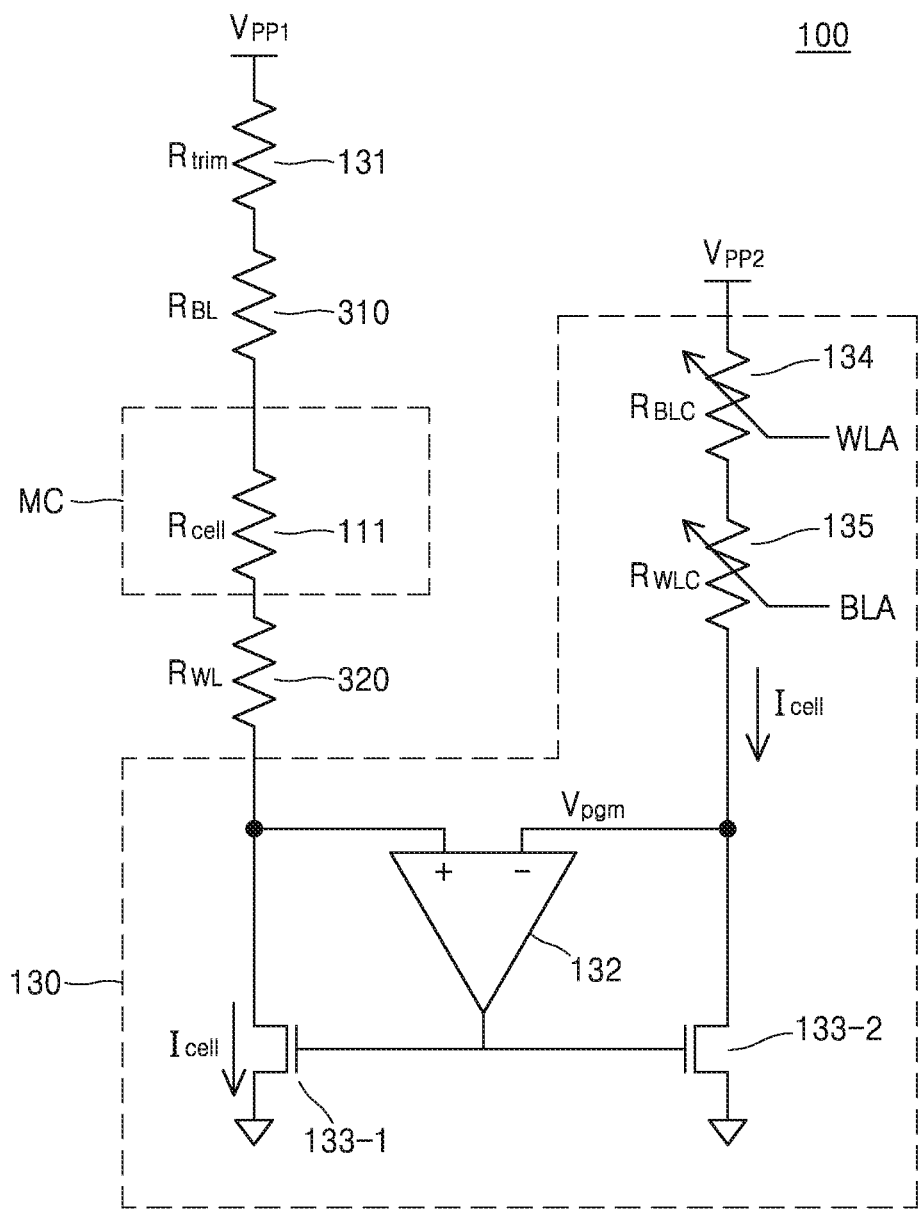
FIG. 9 is a diagram illustrating a compensation circuit including compensation resistors according to some example embodiments.

FIG. 9 is a diagram illustrating the compensation circuit 130 including compensation resistors according to some example embodiments.

According to some example embodiments, the compensation circuit 130 may include the operational amplifier 132, the first transistor 133-1, the second transistor 133-2, the first compensation resistor 134, and the second compensation resistor 135. According to some example embodiments, the compensation circuit 130 may further include a power compensation resistor 131. According to some example embodiments, the power compensation resistor 131 may be provided on the first signal line or the second signal line.

The memory device 100 according to some example embodiments may further include the power compensation resistor 131 in the memory device 100 described above in FIG. 7. In other words, as described in FIG. 7, the compensation circuit 130 may supply uniform current to the memory cell MC. Further, even when the resistance value of the cell resistor 111 changes in the certain range, stable power may be supplied by the power compensation resistor 131. The cell current $I_{cell}$ flowing in the cell resistor 111 of the memory cell MC according to FIG. 9 may be expressed by Formula 5.

$$I_{cell} = \frac{V_{pp1} - V_{pp2}}{R_{cell} + R_{trim}} \quad \text{[Formula 5]}$$

In other words, the compensation circuit 130 may generate the cell current $I_{cell}$ by including the cell resistor 111 and the power compensation resistor 131, similar to the above-described Formula 1. According to some example embodiments, as described above with reference to FIGS. 6A and 6B, when the power compensation resistor 131 is determined by the geometric average of the minimum and maximum resistance values in the certain range of the cell resistor 111, the compensation circuit 130 may supply the stable power to the cell resistor 111 even when the resistance value of the cell resistor 111 varies in the certain range. In addition, the compensation circuit 130 may generate, by adjusting the resistance values of the first compensation resistor 134 and the second compensation resistor 135, the cell current that is independent of the bit line parasitic resistor 310 and the word line parasitic resistor 320 (e.g., independent of the resistance value(s) thereof), and is dependent on the first voltage $V_{pp1}$ and the second voltage $V_{pp2}$. In other words, even when different memory cells MC are selected by the memory controller 200, the uniform current may be generated.

According to some example embodiments, even though the power compensation resistor 131 is illustrated as being connected to the bit line in FIG. 9, since the bit line parasitic resistor 310, the cell resistor 111, and the word line parasitic resistor 320 are all connected in series to each other, it is apparent that the technical idea of the inventive concepts may be applied even when the power compensation resistor 131 is connected to the word line WL. In other words, according to some example embodiments, the power compensation resistor 131 may be connected to a side adjacent to the word line parasitic resistor 320.

According to some example embodiments, the compensation circuit 130 may not include the power compensation resistor 131, similar to the FIG. 7, but instead may control such that a sum of the resistance values of the first compensation resistor 134 and the second compensation resistor 135 has a value that is a sum of the resistance values of the bit line parasitic resistor 310 and the word line parasitic resistor 320 subtracted by a resistance value that the power compensation resistor 131 is required to have. The compensation circuit 130 may receive the word line address WLA and the bit line address BLA; calculate the resistance values of the bit line and word line parasitic resistors 310 and 320; and then calculate a first resistance value (for example, the same value as the resistance value of the power compensation resistor 131) to supply the uniform power based on a variable resistance value of the cell resistor 111. Thereafter, the compensation circuit 130 may control the sum of the resistance values of the first compensation resistor 134 and the second compensation resistor 135 to have a value of the sum of the resistance values of the bit line and word line parasitic resistors 310 and 320 subtracted by the first resistance value. For example, the resistance value of the first compensation resistor 134 may have a value obtained by subtracting the first resistance value from the resistance value of the bit line parasitic resistor 310, and the resistance value of the second compensation resistor 135 may have the same value as the resistance value of the word line parasitic resistor 320. Thus, the compensation circuit 130 may supply the uniform power to the memory cell MC without adding the power compensation resistor 131.

Figure 10:
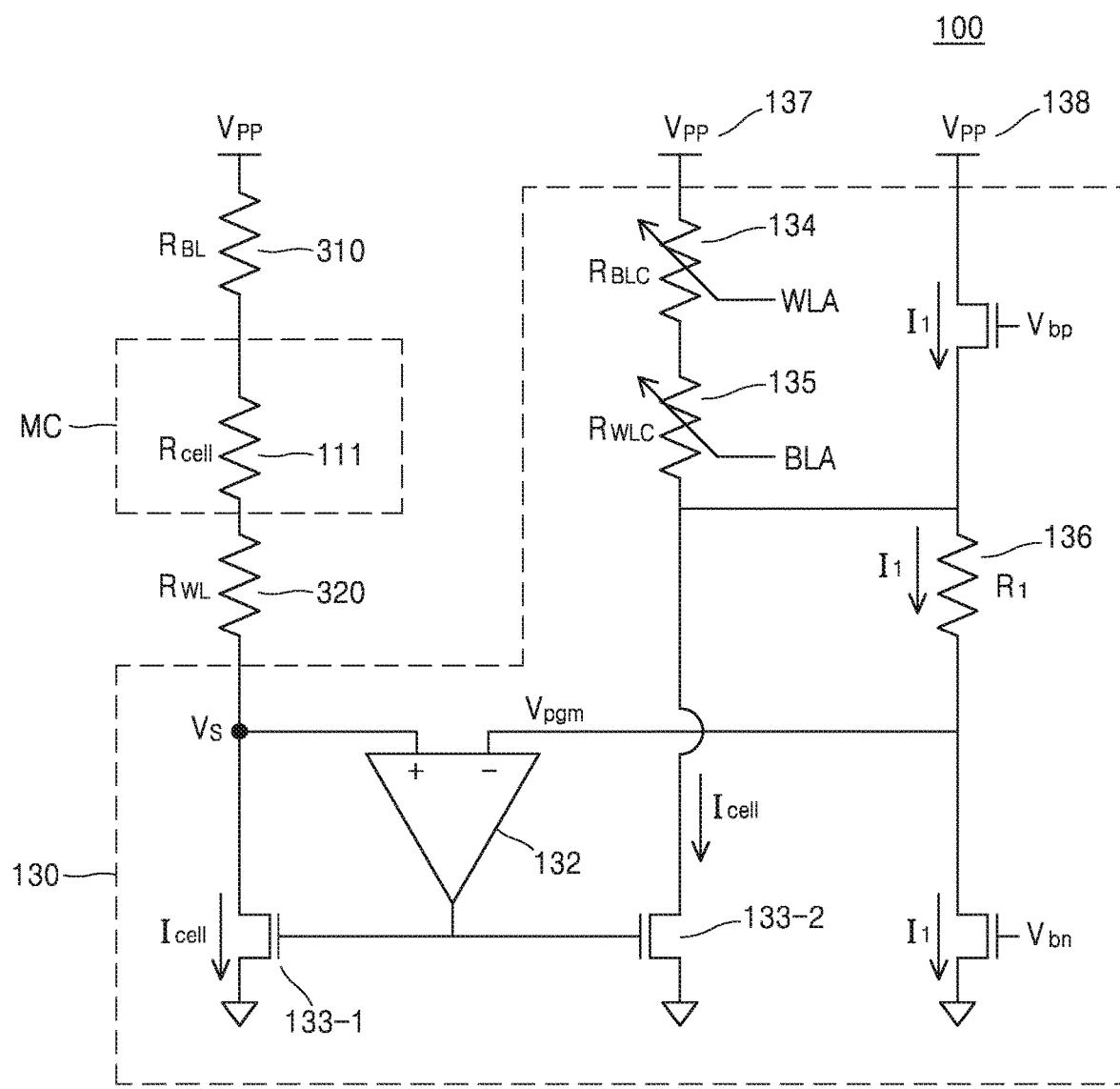
FIG. 10 is a diagram illustrating a compensation circuit including a third compensation resistor according to some example embodiments.

FIG. 10 is a diagram illustrating the compensation circuit 130 including a third compensation resistor 136 according to some example embodiments.

According to FIG. 10, the compensation circuit 130 may further include the third compensation resistor 136 in the compensation circuit 130 according to FIG. 7, and a voltage applied to the bit line BL and a voltage applied to the compensation circuit 130 may be implemented as equal to each other, for example, as the first voltage $V_{pp}$, which may be applied to the compensation circuit 130 from the power generator 150. Unlike illustrated in FIG. 7, since the applied voltages are all the same, an operation of the power generator 150 may be simplified.

The compensation circuit 130 may include a first terminal 137 receiving power from the outside, the first compensation resistor 134 and the second compensation resistor 135 which are connected to each other (e.g., are each connected to the first terminal 137), and a second terminal 138 receiving power from the outside and the third compensation resistor 136 that are connected to each other. In this case, one side of the third compensation resistor 136 may be connected to a node adjacent to the second compensation resistor 135, and the other side of the third compensation resistor 136 may be connected to the inverting input terminal of the operational amplifier 132.

According to an example, the compensation circuit 130 may be unrelated with the bit line and word line parasitic resistors 310 and 320, and may generate the cell current $I_{cell}$ that is determined based on the voltage values applied to the cell resistor 111 and the third compensation resistor 136. A voltage Vs at the non-inverting input terminal (e.g., a first node voltage) and the second voltage $V_{pgm}$ at the inverting input terminal of the operational amplifier 132 (e.g., a second node voltage) may be expressed by Formula 6 below, and both voltages may be the same by the virtual short principle of the operational amplifier 132.

$$V_s = V_{pp} - I_{cell} * (R_{BL} + R_{WL}) - I_{cell} * R_{cell} \quad \text{[Formula 6]}$$
$$V_{pgm} = V_{pp} - I_{cell} * (R_{BL} + R_{WL}) - I_1 * R_1$$
$$V_s = V_{pgm}$$
$$\therefore I_{cell} = \frac{I_1 R_1}{R_{cell}}$$

Restating the above, the operational amplifier 132 may receive a first node voltage ($V_s$) that is a voltage obtained through a first voltage ($V_{pp1}$) applied to the memory cell MC from the outside subtracted by a voltage drop due to the memory cell MC ($I_{cell}*R_{cell}$) and the parasitic resistor ($I_{cell}*(R_{BL}+R_{WL})$), and a second node voltage ($V_{pgm}$) that is a voltage obtained through a second voltage ($V_{pp2}$) applied to the compensation circuit 130 from the outside subtracted by a voltage drop due to the compensation resistor ($I_1*R_1$) and ($I_{cell}*(R_{BL}+R_{WL})$). According to an example, a resistance value $R_1$ and a current $I_1$ of the third compensation resistor 136 may be maintained as uniform values rather than variable values, respectively. The third compensation resistor 136 may be implemented as a fixed resistor rather than a variable resistor, and a resistance value thereof may be determined by a design value.

Accordingly, the compensation circuit 130 may generate the cell current $I_{cell}$ that is unrelated with the bit line and word line parasitic resistors 310 and 320.

Although not illustrated, the memory device 100 according to FIG. 10 may also include the power compensation resistor 131. As an example, similar to as illustrated in FIG. 9, the power compensation resistor 131 may be connected in series to the side of the bit line BL. As another example, the power compensation resistor 131 may be connected in series to the side of the word line WL.

Figure 11:
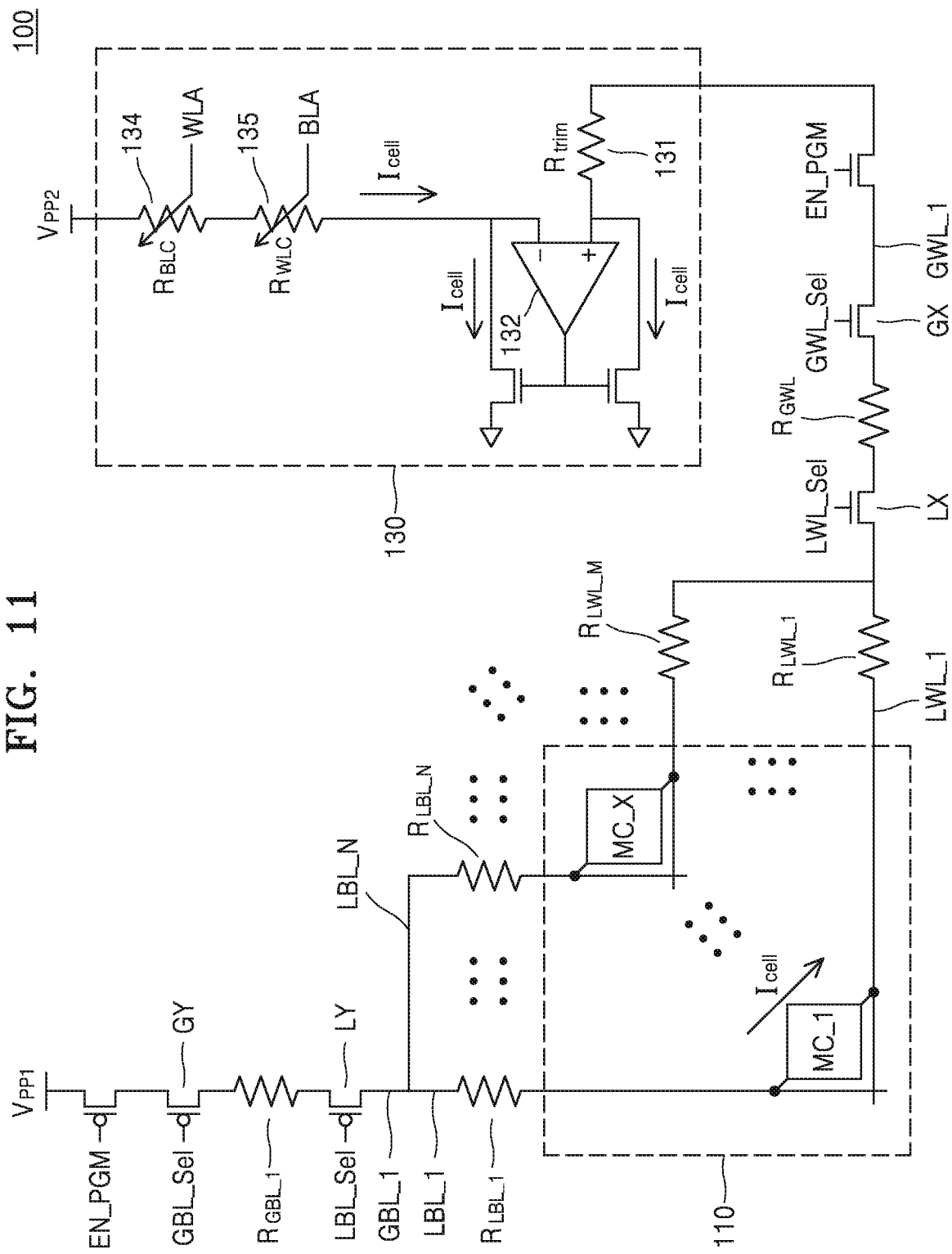
FIG. 11 is a diagram for explaining in detail the memory device of FIGS. 4 and 9.

FIG. 11 is a diagram for explaining in detail the memory device 100 of FIGS. 4 and 9.

Referring to FIG. 11, the memory device 100 may include the memory cell array 110 and the compensation circuit 130. The memory cell array 110 may be electrically connected to the compensation circuit 130. The memory cell array 110 may be electrically connected to the input terminal of the first voltage $V_{pp1}$ for reading and/or writing data, the global bit line GBL_1, the first local bit line LBL_1, the first local word line LWL_1, and the global word line GWL_1. The compensation circuit 130 may be connected to the memory cell array 110 via the first local word line LWL_1 and the global word line GWL_1. Contents overlapping with those given with reference to FIGS. 4 and 9 are omitted.

According to some example embodiments, it is assumed that a memory controller (for example, 200 in FIG. 1) has transmitted the command CMD and the address ADDR for the first memory cell MC_1 to the memory device 100. The cell current $I_{cell}$ flowing in the first memory cell MC_1 may be applied to the compensation circuit 130 via the signal lines. The compensation circuit 130 may adjust the cell current $I_{cell}$ by copying the applied cell current $I_{cell}$ by using the current mirror, and by adjusting the resistance values of the first compensation resistor 134 and the second compensation resistor 135.

The compensation circuit 130 may adjust the resistance value of the first compensation resistor 134 to a sum of the global bit line parasitic resistance $R_{GBL\_1}$ and the local bit line parasitic resistance $R_{LBL\_1}$ corresponding to the selected first memory cell MC_1. The compensation circuit 130 may adjust the resistance value of the second compensation resistor 135 to a sum of the global word line parasitic resistance $R_{GWL\_1}$ and the local word line parasitic resistance $R_{LWL\_1}$ corresponding to the selected first memory cell MC_1. According to some example embodiments, the compensation circuit 130 may include the power compensation resistor 131. The compensation circuit 130 may stably supply the power to the first memory cell MC_1 by including the power compensation resistor 131.

Figure 12A:
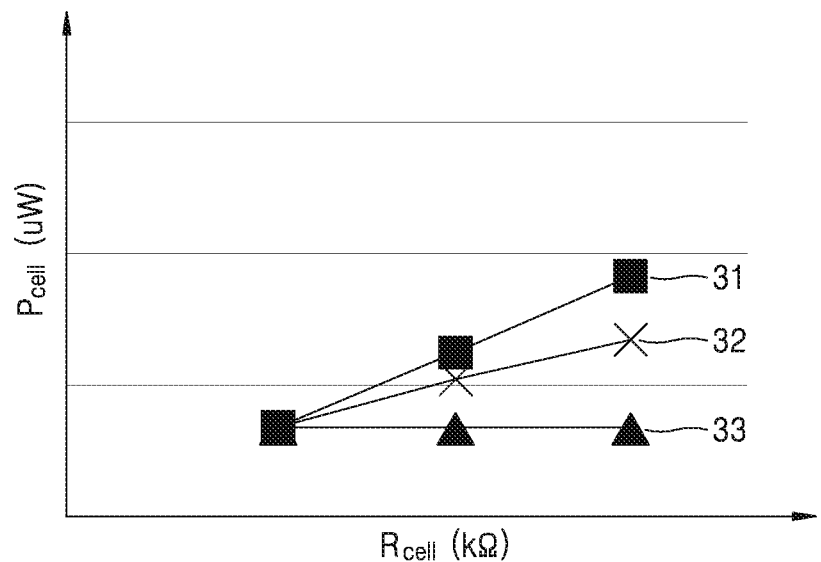
FIG. 12A is a diagram for explaining power supplied to a memory cell.
Figure 12B:
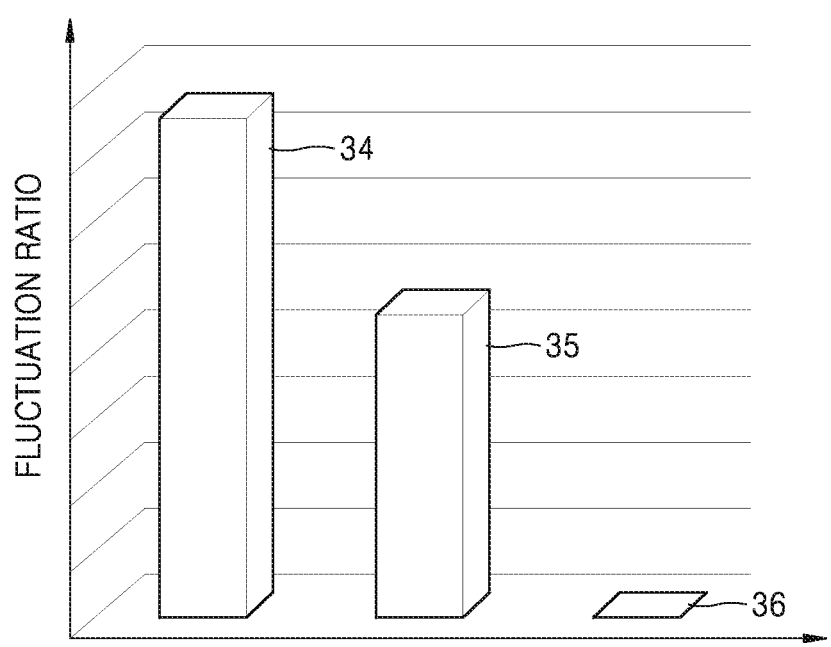
FIG. 12B is a diagram for explaining a heat fluctuation ratio according to some example embodiments.

FIG. 12A is a diagram for explaining power supplied to the memory cell MC, and FIG. 12B is a diagram for explaining a heat fluctuation ratio according to some example embodiments.

Referring to FIG. 12A, the horizontal axis represents a magnitude of the cell resistance $R_{cell}$ and the vertical axis represents cell power $P_{cell}$ to be supplied to the memory cells MC. FIG. 12B illustrates the heat fluctuation ratio which represents that a change amount of the cell power $P_{cell}$ increases according to a magnitude change of the cell resistance $R_{cell}$ as a value of the vertical axis increases.

Referring to FIG. 12A, in comparative examples 31 and 32, the cell power $P_{cell}$ supplied to the memory cell MC for writing and/or reading may greatly vary as a cell resistance $R_{cell}$ changes. However, according to some example embodiments, in the case of the memory device 100 including the power compensation resistor 131, the cell power $P_{cell}$ supplied to the memory cell MC may be maintained uniform 33 even when the cell resistance $R_{cell}$ changes. Thus, a distribution of a reset operation may be further narrowed.

In addition, referring to FIG. 12B, comparative examples 34 and 35 may illustrate a large fluctuation in electric power due to a resistance change. However, the memory device 100 according to an example 36 corresponding to some example embodiments may have little fluctuation in the electric power even with the resistance change supplied to the memory cell MC and thus durability of the phase change material may be improved.

Figure 13:
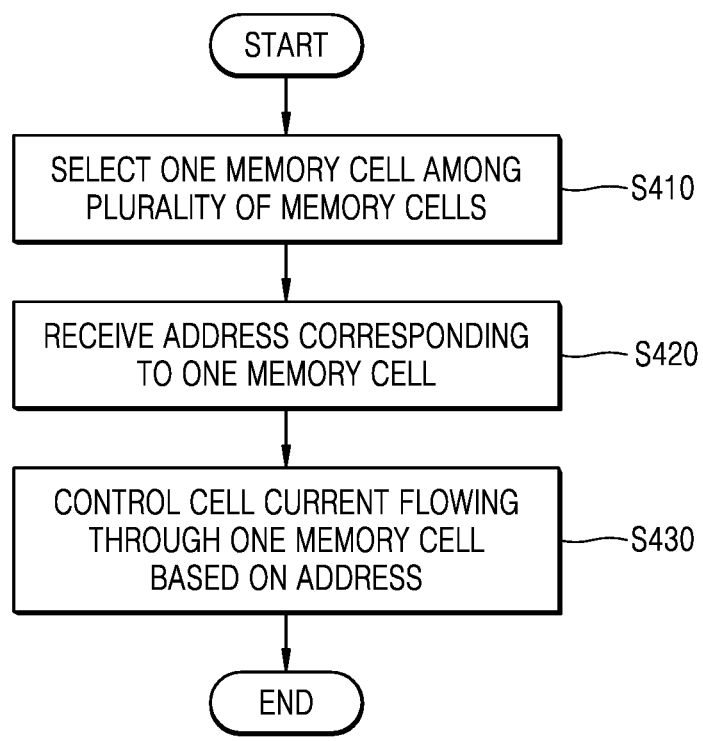
FIG. 13 is a flow chart for explaining an operation method of a memory device according to some example embodiments.

FIG. 13 is a flowchart for explaining an operation method of the memory device 100 according to some example embodiments.

According to some example embodiments, the memory device 100 may select one memory cell MC among the plurality of memory cells MC by using the command CMD and the address ADDR signals of the memory controller 200 (S410). The memory device 100 may select a memory cell MC to process data for writing and/or reading.

Thereafter, the memory device 100 may receive the address ADDR corresponding to the selected memory cell MC (S420). In one example, the memory device 100 may receive the address ADDR, and the control logic 120 may differentiate the bit line address BLA and the word line address WLA to be received by the compensation circuit 130.

The compensation circuit 130 may control the cell current $I_{cell}$ flowing in the selected memory cell MC based on the address ADDR (S430). In one example, the compensation circuit 130 may receive the bit line address BLA and the word line address WLA to calculate bit line parasitic resistances and word line parasitic resistances included in a selected memory cell. The compensation circuit 130 may generate a cell current flowing in a memory cell regardless of a value of a parasitic resistance by adjusting a compensation resistance equal to a value of a calculated parasitic resistance.

Figure 14:
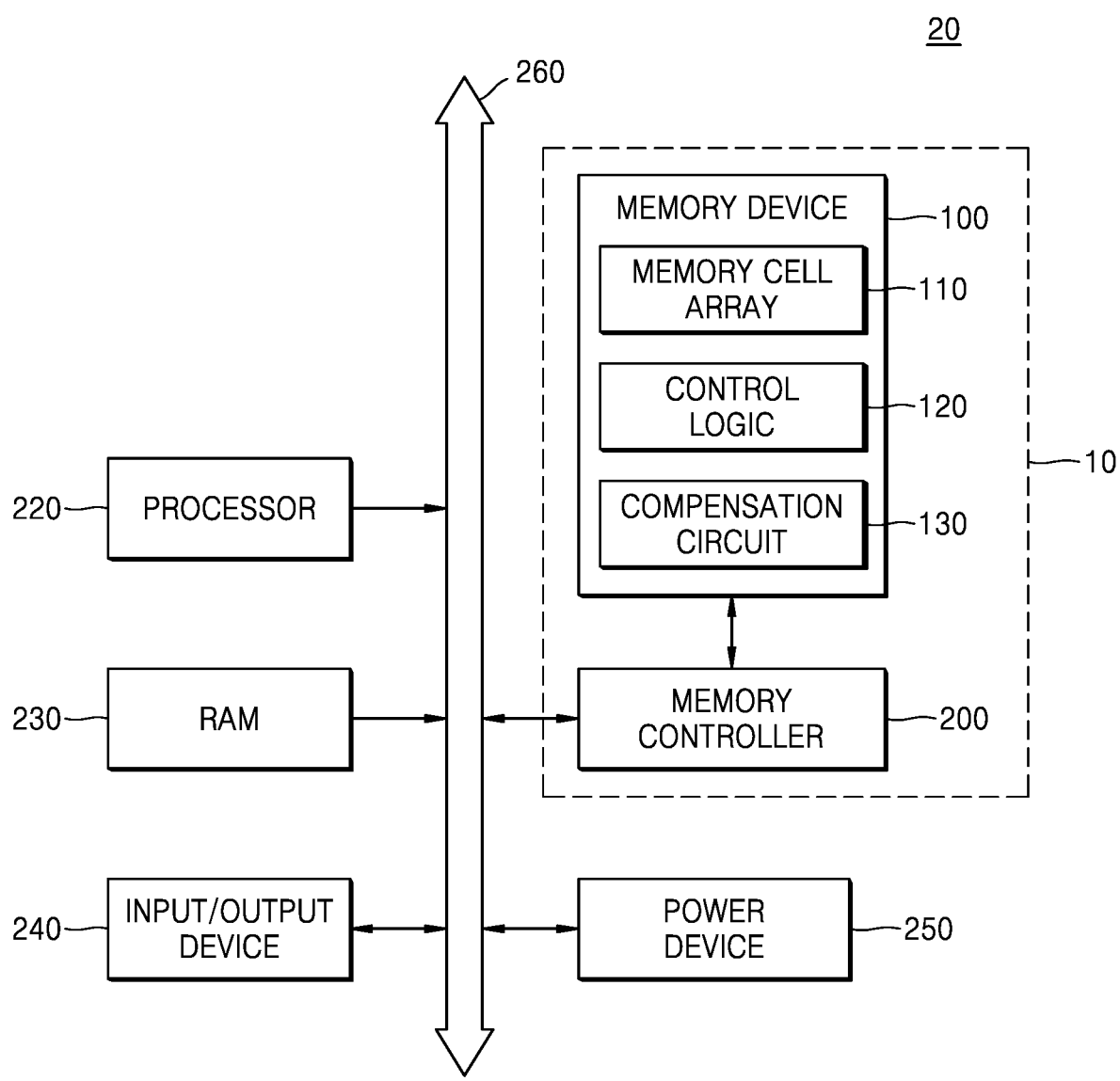
FIG. 14 is a block diagram illustrating a computing system including a memory system according to some example embodiments.

FIG. 14 is a block diagram illustrating a computing system 20 including the memory system 10 according to some example embodiments.

Referring to FIG. 14, the computing system 20 may include the memory system 10, a processor 220, RAM 230, an input/output device 240, and a power supply 250. According to some example embodiments, even though not illustrated in FIG. 14, the computing system 20 may further include ports capable of communicating with a video card, a sound card, a memory card, a universal serial bus (USB) device, and the like, or communicating with other electronic devices. The computing system 20 may be implemented as a personal computer or a portable electronic device such as a notebook computer, a mobile phone, a personal digital assistant (PDA), and a camera.

The processor 220 may perform certain calculations or tasks. According to some example embodiments, the processor 220 may be a micro-processor or a central processing unit (CPU). The processor 220 may perform communication with the RAM 230, the input/output device 240, and the memory system 10 via a bus 260 such as an address bus, a control bus, and a data bus. Here, the computing system 20 may be implemented by using the embodiments illustrated in FIGS. 1 through 13. Since the memory system 10 includes the compensation circuit 130, a cell current and power may be stably supplied to the memory cell array 110 and a distribution due to writing and/or reading operations of a memory cell may be improved by controlling an effect of a parasitic resistor.

According to some example embodiments, the processor 220 may also be connected to an expansion bus such as a peripheral component interconnect (PCI) bus.

The RAM 230 may store data required for operations of the computing system 20. The RAM 230 may be implemented as, for example, dynamic RAM (DRAM), mobile DRAM, static RAM (SRAM), PRAM, ferroelectric RAM (FRAM), RRAM, and/or MRAM.

The input/output device 240 may include input elements such as a keyboard, a keypad, and a mouse, and output elements such as a printer and a display. The power supply 250 may supply an operating voltage required for operations of the computing system 20.

As described above, embodiments have been disclosed in the drawings and specification. While the embodiments have been described herein with reference to specific terms, it should be understood that they have been used only for the purpose of describing the technical idea of the inventive concepts and not for limiting the scope of the inventive concepts as defined in the claims. Therefore, it will be clearly understood by one of ordinary skill in the art that various modifications and equivalent embodiments are possible without departing from the scope of the inventive concepts. Accordingly, the true scope of protection of the inventive concepts should be determined by the technical idea of the following claims.

What is claimed is:

1. A memory device, comprising:
a memory cell array including a plurality of memory cells; and
a compensation circuit electrically connected to the memory cell array, the compensation circuit configured to generate a cell current to compensate for a voltage drop generated in a parasitic resistor of a signal line connected to a selected memory cell of the plurality of memory cells;
a power generator; and
a control logic,
wherein the compensation circuit is configured to generate the cell current based on at least one compensation resistor of the compensation circuit, and the cell current is based on a first voltage applied to the selected memory cell and a second voltage applied to the compensation circuit from the power generator,
wherein the compensation circuit includes a first compensation resistor, a second compensation resistor, and a third compensation resistor, and the compensation circuit is configured to receive the second voltage from a first terminal and a third voltage from a second terminal, wherein the first compensation resistor and the second compensation resistor are connected to the first terminal, and the third compensation resistor is connected to the second terminal.

2. The memory device of claim 1, wherein the compensation circuit is configured to control a magnitude of resistance of the at least one compensation resistor upon receiving an address corresponding to the selected memory cell.

3. The memory device of claim 2, wherein the compensation circuit is configured to increase a magnitude of the cell current based on adjusting the magnitude of resistance of the at least one compensation resistor to be substantially equal to a resistance value of the parasitic resistor.

4. The memory device of claim 3, further comprising:
a power compensation resistor corresponding to each memory cell among the plurality of memory cells, wherein a resistance value of the power compensation resistor increases as a cell resistance value of the selected memory cell increases.

5. The memory device of claim 4, wherein the power compensation resistor is connected to at least one of a bit line and a word line connected to the selected memory cell, and the resistance value of the power compensation resistor is greater than a minimum resistance value of the selected memory cell and less than a maximum resistance value of the selected memory cell.

6. The memory device of claim 4, wherein the compensation circuit includes the power compensation resistor and is configured to control power supplied to the selected memory cell based on adjusting the resistance value of the power compensation resistor.

7. The memory device of claim 1, wherein a voltage applied to the selected memory cell is equal to a voltage applied to the compensation circuit from the power generator.

8. The memory device of claim 1, wherein
the compensation circuit includes a current mirror configured to generate a current, that is equal in magnitude to the cell current, flowing in one or more compensation resistors of the compensation circuit, and
the current mirror includes a first transistor and a second transistor, wherein the first transistor is electrically connected to the selected memory cell and the second transistor is electrically connected to the compensation circuit.

9. The memory device of claim 8, wherein
the compensation circuit includes an operational amplifier configured to
receive a first node voltage that is the first voltage applied to the selected memory cell from outside the compensation circuit subtracted by a voltage drop due to the selected memory cell and the parasitic resistor, and
receive a second node voltage that is another voltage applied to the compensation circuit from outside the compensation circuit subtracted by a voltage drop due to the at least one compensation resistor.

10. The memory device of claim 9, wherein
gate terminals of the first transistor and the second transistor are connected to an output terminal of the operational amplifier,
a wire connected to the selected memory cell is connected to a first input terminal of the operational amplifier, and
a wire connected to the at least one compensation resistor is connected to a second input terminal of the operational amplifier.

11. The memory device of claim 4,
wherein the power generator is configured to
generate the first voltage based on a cell address received from the control logic, and
apply the first voltage based on being connected in series to the power compensation resistor and the selected memory cell which are connected to each other in series, wherein the cell address includes the address corresponding to the selected memory cell, and the first voltage is proportional to the resistance value of the parasitic resistor.

12. A memory device, comprising:
a memory cell array including a plurality of memory cells;
a first signal line connected to a first terminal of each of the plurality of memory cells;
a second signal line connected to a second terminal of each of the plurality of memory cells;
a compensation circuit electrically connected to the memory cell array, the compensation circuit including at least one power compensation resistor which is connected to the first signal line or the second signal line, wherein a resistance value of the at least one power compensation resistor is based on a cell resistance value of a selected memory cell;
a power generator; and
a control logic,
wherein the compensation circuit is configured to generate a cell current based on at least one compensation resistor of the compensation circuit, and the cell current is based on a first voltage applied to the selected memory cell and a second voltage applied to the compensation circuit from the power generator; and
wherein the compensation circuit includes a first compensation resistor, a second compensation resistor, and a third compensation resistor, and the compensation circuit is configured to receive the second voltage from a first terminal of the compensation circuit and a third voltage from a second terminal of the compensation circuit, wherein the first compensation resistor and the second compensation resistor are connected to the first terminal of the compensation circuit, and the third compensation resistor is connected to the second terminal of the compensation circuit.

13. The memory device of claim 12, wherein power supplied to the plurality of memory cells and a state of a phase change material of the plurality of memory cells is based on the resistance value of the power compensation resistor.

14. The memory device of claim 12, further comprising:
a parasitic resistor in at least one signal line of the first signal line and the second signal line,
wherein the at least one compensation resistor is configured to compensate for a voltage drop generated in the parasitic resistor to the plurality of memory cells.

15. The memory device of claim 13, wherein the resistance value of the power compensation resistor is less than a maximum value of the cell resistance value of the selected memory cell and greater than a minimum value of the cell resistance value of the selected memory cell.

16. The memory device of claim 13, further comprising:
an operational amplifier connected to the second terminal of each of the plurality of memory cells, wherein a voltage is applied to the plurality of memory cells via an input terminal of the operational amplifier.

17. An operation method of a memory device, the operation method comprising:
selecting one memory cell among a plurality of memory cells;
receiving an address corresponding to the one memory cell;
controlling a cell current flowing in the one memory cell based on the address to compensate for a voltage drop generated in a parasitic resistor of a signal line connected to the one memory cell, wherein
a compensation circuit electrically connected to the plurality of memory cells generates the cell current based on at least one compensation resistor, and the cell current is based on a first voltage applied to the one memory cell and a second voltage applied to the compensation circuit from a power generator, and
the compensation circuit includes a first compensation resistor, a second compensation resistor, and a third compensation resistor, and the compensation circuit receives the second voltage from a first terminal and a third voltage from a second terminal, wherein the first compensation resistor and the second compensation resistor are connected to the first terminal, and the third compensation resistor is connected to the second terminal.

18. The operation method of claim 17, wherein the controlling includes controlling a magnitude of the cell current based on a resistance value of the parasitic resistor, and the magnitude of the cell current is independent of the resistance value of the parasitic resistor and is based on a cell resistance value of the one memory cell.

* * * * *